(12) United States Patent
Lee et al.

(10) Patent No.: US 11,867,757 B2
(45) Date of Patent: Jan. 9, 2024

(54) BUILT-IN SELF-TEST CIRCUITS AND SEMICONDUCTOR INTEGRATED CIRCUITS INCLUDING THE SAME

(71) Applicant: Samsung Electronics Co., Ltd., Suwon-si (KR)

(72) Inventors: Heejune Lee, Hwaseong-si (KR); Jinwoo Park, Hwaseong-si (KR); Younghyo Park, Suwon-si (KR); Eunhye Oh, Yongin-si (KR); Sungno Lee, Hwaseong-si (KR); Youngjae Cho, Hwaseong-si (KR); Michael Choi, Seoul (KR)

(73) Assignee: Samsung Electronics Co., Ltd.

( * ) Notice: Subject to any disclaimer, the term of this patent is extended or adjusted under 35 U.S.C. 154(b) by 5 days.

(21) Appl. No.: 17/465,337

(22) Filed: Sep. 2, 2021

(65) Prior Publication Data
US 2022/0187366 A1 Jun. 16, 2022

(30) Foreign Application Priority Data

Dec. 14, 2020 (KR) .................. 10-2020-0174634

(51) Int. Cl.
*G01R 31/317* (2006.01)
*H03M 1/10* (2006.01)

(52) U.S. Cl.
CPC . *G01R 31/31725* (2013.01); *G01R 31/31724* (2013.01); *H03M 1/1071* (2013.01)

(58) Field of Classification Search
None
See application file for complete search history.

(56) References Cited

U.S. PATENT DOCUMENTS 6,557,131 B1 * 4/2003 Arabi ................... H03M 1/109
714/733
8,510,073 B2   8/2013 Dasnurkar
(Continued)

FOREIGN PATENT DOCUMENTS

KR   19980058601 U   10/1998
KR   20010058532 A   7/2001
(Continued)

*Primary Examiner* — Patrick Assouad
*Assistant Examiner* — Haidong Zhang
(74) *Attorney, Agent, or Firm* — Myers Bigel, P.A.

(57) ABSTRACT

A semiconductor integrated circuit includes a digital-to-analog converter and a built-in self-test circuit. The digital-to-analog converter performs a normal conversion operation to generate an analog output signal by converting a digital input signal corresponding to an external digital signal that is provided from an external device outside the semiconductor integrated circuit and provide the analog output signal to the external device. The built-in self-test circuit, while the digital-to-analog converter performs the normal conversion operation, performs a real-time monitoring operation to generate a comparison alarm signal based on the digital input signal and the analog output signal such that the comparison alarm signal indicates whether the digital-to-analog converter operates normally. Performance and reliability of the digital-to-analog converter and the semiconductor integrated circuit including the digital-to-analog converter may be enhanced by monitoring in real-time abnormality of the digital-to-analog converter using the on-time monitor.

18 Claims, 28 Drawing Sheets

(56) References Cited

U.S. PATENT DOCUMENTS

| | | | |
|---|---|---|---|
| 9,692,437 B2 | 6/2017 | Jeon et al. | |
| 2012/0075130 A1* | 3/2012 | Zhang | H03M 1/109 341/120 |
| 2016/0231378 A1* | 8/2016 | Abhishek | G01R 31/3163 |
| 2019/0026205 A1* | 1/2019 | Jin | H03M 1/108 |
| 2019/0178938 A1* | 6/2019 | Jin | G01R 31/3167 |

FOREIGN PATENT DOCUMENTS

| | | |
|---|---|---|
| KR | 100318446 B1 | 2/2002 |
| KR | 100341575 B1 | 6/2002 |
| KR | 20160134923 A | 11/2016 |

\* cited by examiner

PASS TEST OPERATION
( MD = '01' )

FAIL TEST OPERATION
( MD = '11' )

BUILT-IN SELF-TEST CIRCUITS AND SEMICONDUCTOR INTEGRATED CIRCUITS INCLUDING THE SAME

CROSS-REFERENCE TO RELATED APPLICATION

This U.S. non-provisional application claims priority under 35 USC § 119 to Korean Patent Application No. 10-2020-0174634, filed on Dec. 14, 2020, in the Korean Intellectual Property Office (KIPO), the disclosure of which is incorporated by reference herein in its entirety.

BACKGROUND

The present disclosure relates generally to semiconductor integrated circuits and, more particularly, to test circuits. Data converters such as digital-to-analog converters and analog-to-digital converters are configured to convert a digital signal to an analog signal or an analog signal to a digital signal. The analog-to-digital converter may be used to convert analog signals generated by various sensors to digital signals, and the digital-to-analog converter may be used to convert digital control signals to analog signals for driving circuits and devices.

The data converters used in industrial fields, such as the automobile industry, the aerospace industry, the biotechnology industry, and so forth, may require a high degree of safety and reliability. Particularly, the abnormal operation of the data converters included in an autonomous driving system of vehicles (e.g., land-based vehicles and/or aircraft) may cause serious danger.

SUMMARY

Some example embodiments may provide a built-in self-test circuit capable of monitoring in real time an abnormal operation of a digital-to-analog converter.

Some example embodiments may provide a semiconductor integrated circuit including a built-in self-test circuit capable of monitoring in real time an abnormal operation of a digital-to-analog converter.

According to example embodiments, a semiconductor integrated circuit includes a digital-to-analog converter and a built-in self-test circuit. The digital-to-analog converter performs a normal conversion operation to generate an analog output signal by converting a digital input signal corresponding to an external digital signal that is provided from an external device outside the semiconductor integrated circuit and provide the analog output signal to the external device. The built-in self-test circuit, while the digital-to-analog converter performs the normal conversion operation, performs a real-time monitoring operation to generate a comparison alarm signal based on the digital input signal and the analog output signal such that the comparison alarm signal indicates whether the digital-to-analog converter operates normally.

According to example embodiments, a semiconductor integrated circuit includes a first input multiplexer, a second input multiplexer, a digital-to-analog converter, an analog-to-digital converter and a built-in self-test circuit. The first input multiplexer outputs a digital input signal by selecting one of a digital test signal and an external digital signal that is provided from an external device outside the semiconductor integrated circuit. The digital-to-analog converter performs a first normal conversion operation to generate an analog output signal by converting the digital input signal and provide the analog output signal corresponding to the external digital signal to the external device. The second input multiplexer outputs an analog input signal by selecting one of an analog test signal and an external analog signal that is provided from the external device. The analog-to-digital converter performs a second normal conversion operation to generate a digital output signal by converting the analog input signal and provide the digital output signal corresponding to the external analog signal to the external device. The built-in self-test circuit, while the digital-to-analog converter performs the first normal conversion operation, performs a real-time monitoring operation to generate a comparison alarm signal based on the digital input signal and the analog output signal such that the comparison alarm signal indicates whether the digital-to-analog converter operates normally.

According to example embodiments, a built-in self-test circuit for monitoring a digital-to-analog converter that generates an analog output signal by converting a digital input signal, includes, an analog-to-digital converter configured to generate a digital output signal by converting the analog output signal, a digital test signal generator configured to generate a digital test signal, an input multiplexer configured to output the digital input signal by selecting one of an external digital signal and the digital test signal, and an on-time monitor configured to, while the digital-to-analog converter performs a normal conversion operation to generate the analog output signal by converting the digital input signal that is output by selecting the external digital signal, perform a real-time monitoring operation to monitor whether the digital-to-analog converter operates normally based on a result of comparing the digital input signal and the digital output signal.

The built-in self-test circuit according to example embodiments may enhance performance and reliability of the digital-to-analog converter and the semiconductor integrated circuit including the digital-to-analog converter by monitoring in real-time abnormality of the digital-to-analog converter using the on-time monitor.

In addition, the built-in self-test circuit according to example embodiments may further enhance reliability of the digital-to-analog converter and the semiconductor integrated circuit including the digital-to-analog converter by testing abnormality of the on-time monitor.

BRIEF DESCRIPTION OF THE DRAWINGS

Example embodiments of the present disclosure will be more clearly understood from the following detailed description taken in conjunction with the accompanying drawings.

DETAILED DESCRIPTION

Figure 1:
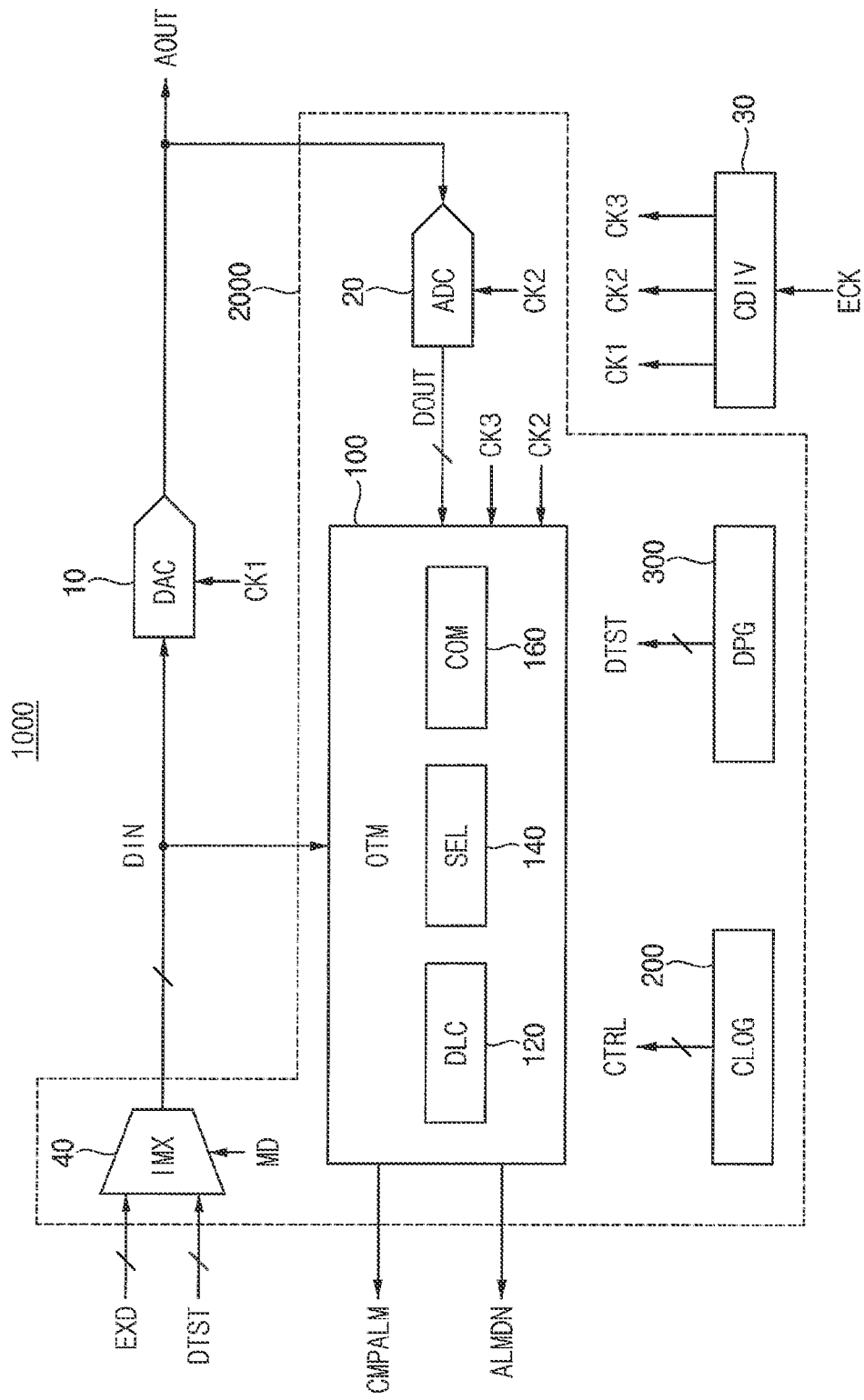
FIG. 1 is a block diagram illustrating a semiconductor integrated circuit according to example embodiments.

Various example embodiments will be described more fully hereinafter with reference to the accompanying drawings, in which some example embodiments are shown. In the drawings, like numerals refer to like elements throughout. Repeated descriptions of like elements may be omitted.

Figure 2:
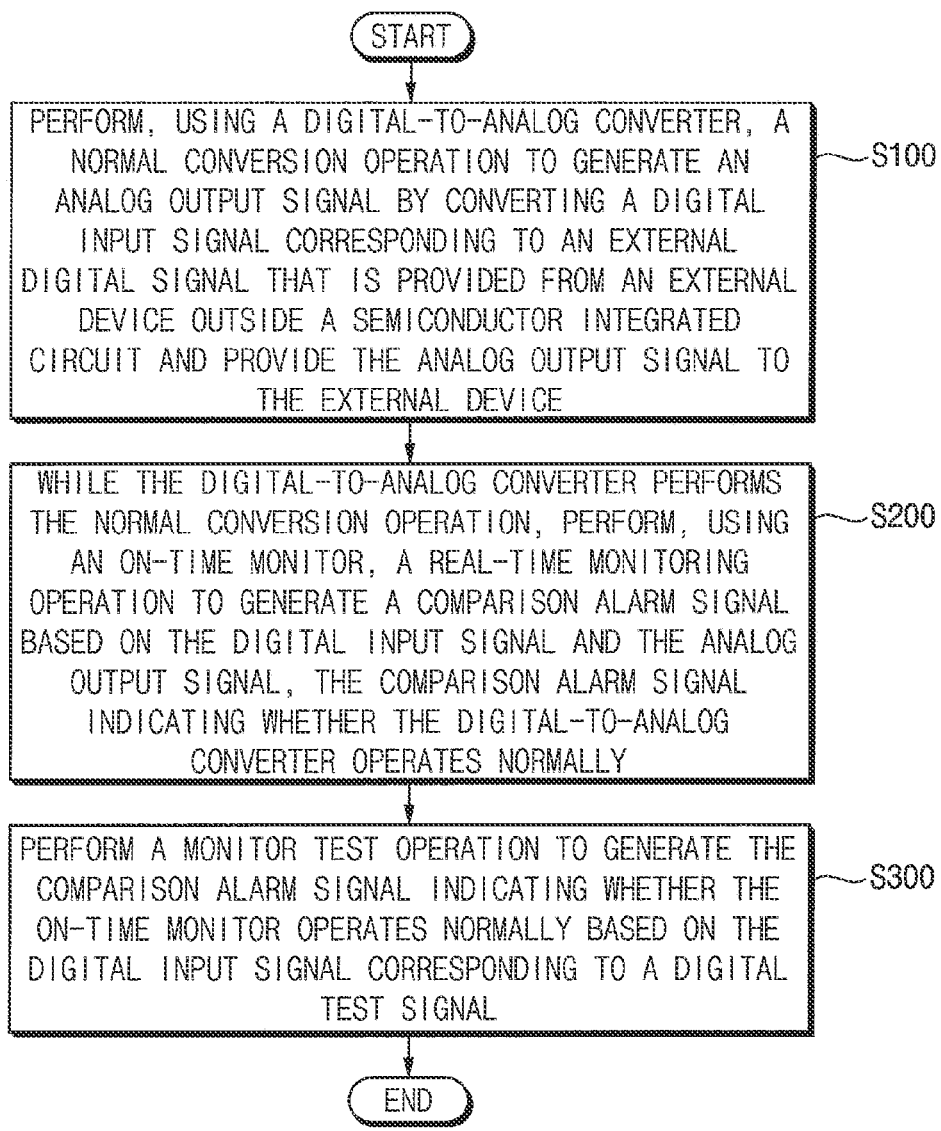
FIG. 2 is a flow chart illustrating a method of operating a built-in self-test circuit according to example embodiments.

FIG. 1 is a block diagram illustrating a semiconductor integrated circuit according to example embodiments, and FIG. 2 is a flow chart illustrating a method of operating a built-in self-test circuit according to example embodiments.

Referring to FIGS. 1 and 2, a semiconductor integrated circuit 1000 may include a digital-to-analog converter DAC 10, a built-in self-test circuit 2000 and a clock divider CDIV 30.

The digital-to-analog converter 10 may perform a normal conversion operation to generate an analog output signal AOUT by converting a digital input signal DIN corresponding to an external digital signal EXD that is provided from an external device outside the semiconductor integrated circuit 1000 and provide the analog output signal AOUT to the external device (Block S100).

While the digital-to-analog converter 10 performs the normal conversion operation, the built-in self-test circuit 2000 may perform a real-time monitoring operation to generate a comparison alarm signal CMPALM based on the digital input signal DIN and the analog output signal AOUT such that the comparison alarm signal CMPALM may indicate whether the digital-to-analog converter 10 operates normally (Block S200).

The built-in self-test circuit 2000 may include an on-time monitor OTM 100, a control logic CLOG 200, a digital test signal generator DPG 300, an analog-to-digital converter ADC 20 and an input multiplexer IMX 40. FIG. 1 illustrates an example embodiment in which the analog-to-digital converter 20 and the input multiplexer 40 are included in the built-in self-test circuit 2000, but example embodiments are not limited thereto. In some example embodiments, the analog-to-digital converter 20 and/or the input multiplexer 40 may be disposed outside the built-in self-test circuit 2000.

The input multiplexer 40 may output the digital input signal DIN by selecting one of the external digital signal EXD and a digital test signal DTST based on a mode signal MD. The mode signal MD may be provided from the external device or from the control logic 200 under control of the external device.

The analog-to-digital converter 20 may generate a digital output signal DOUT by converting the analog output signal AOUT. In some example embodiments, as will be described below with reference to FIG. 24, the analog-to-digital converter 20 may perform an original conversion operation with respect to an external analog signal and may be disposed outside the built-in self-test circuit 2000. In some example embodiments, as will be described below with reference to FIG. 25, the analog-to-digital converter 20 may be dedicated to the real-time monitoring operation and may be disposed in the built-in self-test circuit 2000.

The on-time monitor 100 may include a delay circuit DLC 120, a path selection circuit SEL 140 and a comparison circuit COM 160.

The on-time monitor 100 may perform the real-time monitoring operation to generate the comparison alarm signal CMPALM indicating whether the digital-to-analog converter 10 operates normally based on a result of comparing the digital input signal DIN and the digital output signal DOUT (Block S200). In addition, the on-time monitor 100 may perform a monitor test operation to generate the comparison alarm signal CMPALM indicating whether the on-time monitor 100 operates normally based on the digital input signal DIN corresponding to the digital test signal DTST (Block S300).

For example, the input multiplexer 40 may select the external digital signal EXD as the digital input signal DIN based on the mode signal MD while the on-time monitor 100 performs the real-time monitoring operation. In contrast, the input multiplexer 40 may select the digital test signal DTST as the digital input signal DIN based on the mode signal MD while the on-time monitor 100 performs the monitor test operation.

The on-time monitor 100 may further generate a comparison done signal ALMDN that is activated whenever the comparison circuit 160 performs a comparison operation, regardless of the comparison result, that is, regardless of a value of the comparison alarm signal CMPALM.

The digital test signal generator 300 may generate the digital test signal DTST such that the digital test signal DTST may include various patterns corresponding to the monitor test operation and other test operations.

The clock divider 30 may generate a first clock signal CK1, a second clock signal CK2 and a third clock signal CK3 by dividing an external clock signal ECK. The first clock signal CK1 may have a first frequency and may be provided to the digital-to-analog converter 10. The second clock signal CK2 may have a second frequency and may be provided to the analog-to-digital converter 20. The third clock signal CK3 may have the second frequency and may be provided to the comparison circuit 160. In addition, the second clock signal CK2 may be provided to the delay circuit 120 and the delay circuit 120 may synchronize the digital input signal DIN with the digital output signal DOUT based on the second clock signal CK2 as will be described below.

As such, the built-in self-test circuit 2000 according to example embodiments may enhance performance and reliability of the digital-to-analog converter 10 and the semiconductor integrated circuit 1000 including the digital-to-analog converter 10 by monitoring in real-time abnormality of the digital-to-analog converter 10 using the on-time monitor 100. In addition, the built-in self-test circuit 2000 according to example embodiments may further enhance reliability of the digital-to-analog converter 10 and the semiconductor integrated circuit 1000 including the digital-to-analog converter 10 by testing abnormality of the on-time monitor 100.

Each of the external digital signal EXD, the digital test signal DTST and the digital output signal DOUT may be a multi-bit signal. The bit numbers of the external digital signal EXD, the digital test signal DTST and the digital output signal DOUT may be equal to each other. For example, the external digital signal EXD, the digital test signal DTST and the digital output signal DOUT may each be 12-bit signals.

Figure 3:
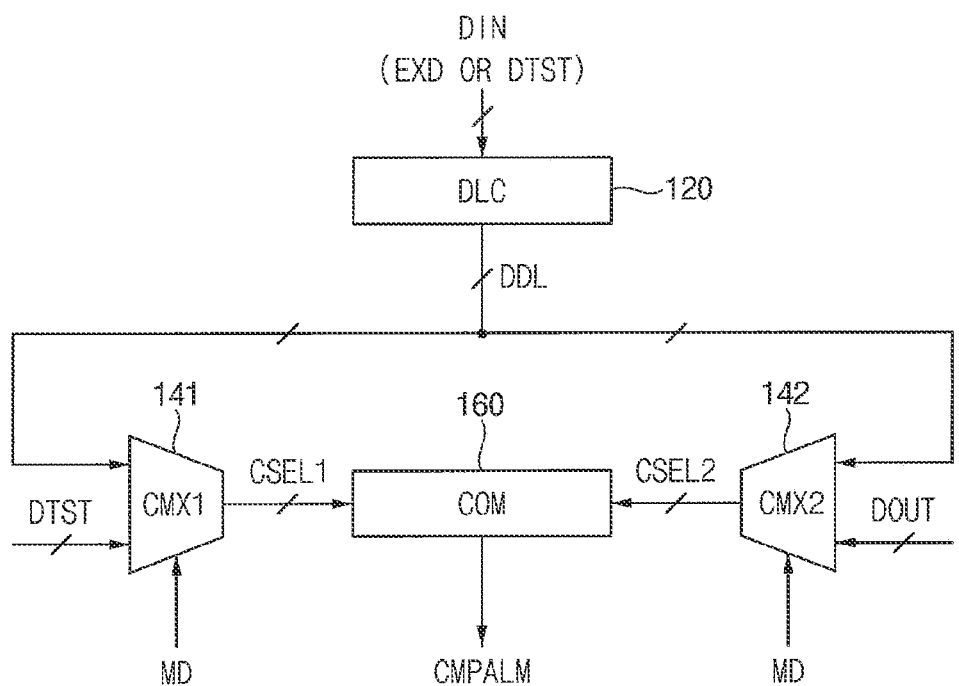
FIGS. 3 and 4 are block diagrams illustrating example embodiments of an on-time monitor included in a built-in self-test circuit according to example embodiments.
Figure 4:
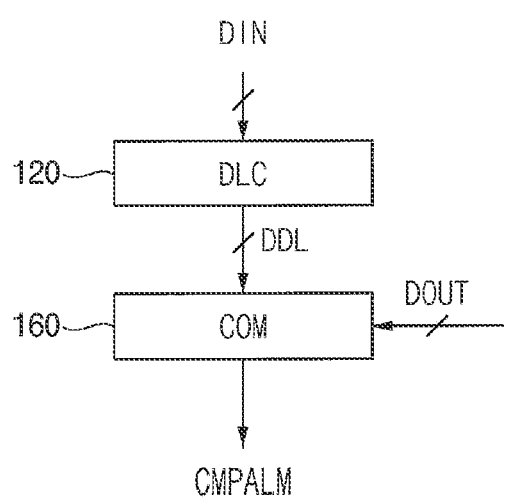

FIGS. 3 and 4 are block diagrams illustrating example embodiments of an on-time monitor included in a built-in self-test circuit according to example embodiments.

Referring to FIG. 3, an on-time monitor 100 may include a delay circuit DLC 120, a first comparison multiplexer CMX1 141, a second comparison multiplexer CMX2 142 and a comparison circuit COM 160. The first comparison multiplexer 141 and the second comparison multiplexer 142 correspond to the path selection circuit 140 in FIG. 1.

The delay circuit 120 may generate a digital delay signal DDL by delaying the digital input signal DIN based on a digital delay amount of the digital-to-analog converter 10 and an analog delay amount of the analog-to-digital converter 20. As described above, the digital input signal DIN may correspond to the external digital signal EXD or the digital test signal DTST depending on the operation mode of the semiconductor integrated circuit 1000.

The first comparison multiplexer 141 may output a first comparison selection signal CSEL1 by selecting one of the digital delay signal DDL and the digital test signal DTST. The second comparison multiplexer 142 may output a second comparison selection signal CSEL2 by selecting one of the digital delay signal DDL and the digital output signal DOUT. The comparison circuit 160 may generate the comparison alarm signal CMPALM by comparing the first comparison selection signal CSEL1 and the second comparison selection signal CSEL2.

Referring to FIG. 4, an on-time monitor 101 may include a delay circuit DLC 120 and a comparison circuit COM 160. In comparison with the on-time monitor 100 of FIG. 3, the on-time monitor 101 of FIG. 4 may not include the first comparison multiplexer 141 and the second comparison multiplexer 142.

The on-time monitor 100 of FIG. 3 has a configuration to perform both of (i) the real-time monitoring operation based on the digital output signal DOUT and the digital input signal DIN corresponding to the external digital signal EXD and (ii) the monitor test operation based on the digital test signal DTST. In contrast, the on-time monitor 101 of FIG. 4 has a configuration to perform only the real-time monitoring operation and the on-time monitor 101 may not perform the monitor test operation. One of the on-time monitor 100 of FIG. 3 and the on-time monitor 101 of FIG. 4 may be adopted depending on the required reliability of the analog-to-digital converter. Hereinafter, the real-time monitoring operation and the monitor test operation will be described based on the on-time monitor 100 of FIG. 3.

Figure 5:
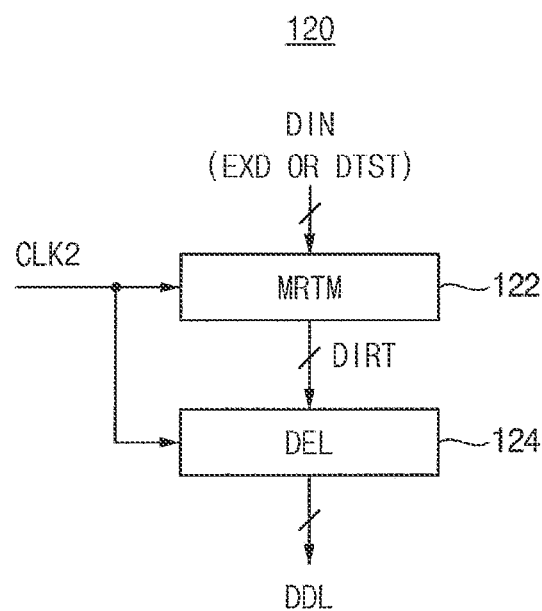
FIG. 5 is a block diagram illustrating an example embodiment of a delay circuit included in the on-time monitor of FIG. 3.

FIG. 5 is a block diagram illustrating an example embodiment of a delay circuit included in the on-time monitor of FIG. 3.

Referring to FIG. 5, a delay circuit 120 may include a monitor retiming circuit MRTM 122 and a delay unit DEL 124.

The monitor retiming circuit 122 may perform a retiming operation to generate a retimed digital signal DIRT by synchronizing the digital input signal DIN with an edge of the second clock signal CK2. The delay unit 124 may perform a delay operation to generate the digital delay signal DDL by delaying the retimed digital signal DIRT by N times of a clock cycle corresponding to the second frequency of the second clock signal CK2 where N is a positive integer. FIG. 5 illustrates that the retiming operation and the delay operation are separately performed by the distinct components 122 and 124, but example embodiments are not limited thereto. In some example embodiments, the retiming operation and the delay operation may be performed simultaneously by a combined component.

As such, the digital input signal DIN may be synchronized with the digital output signal DOUT using the second clock signal CK2 that is used in the conversion operation of the analog-to-digital converter 20. As will be described below, through such synchronization, the comparison circuit 160 may perform the real-time monitoring operation by comparing two corresponding data respectively included in the digital input signal DIN and the digital output signal DOUT.

Figure 6:
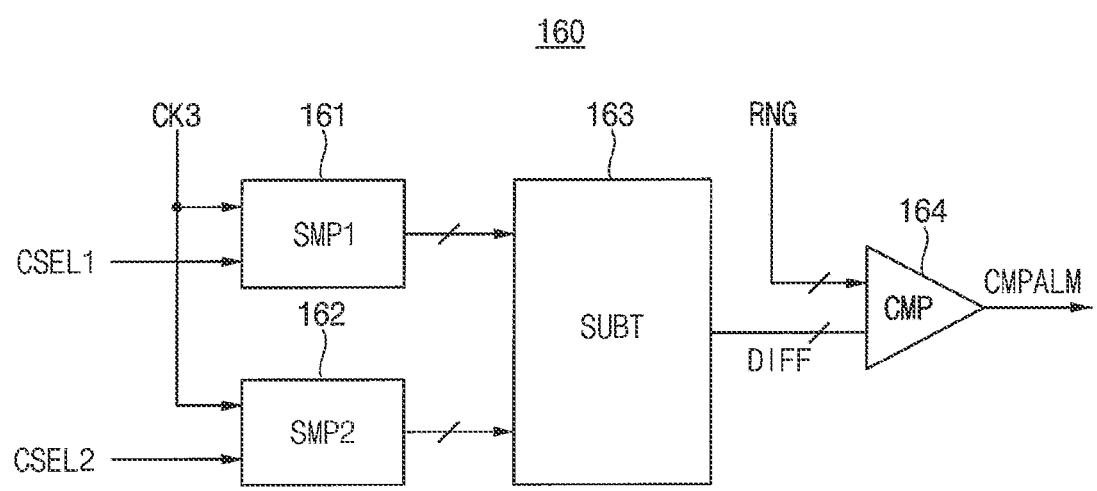
FIG. 6 is a block diagram illustrating an example embodiment of a comparison circuit include in the on-time monitor of FIG. 3.

FIG. 6 is a block diagram illustrating an example embodiment of a comparison circuit included in the on-time monitor of FIG. 3.

Referring to FIG. 6, a comparison circuit 160 may include a first sampler SMP1 161, a second sampler SMP2 162, a subtractor SUBT 163 and a comparator CMP 164.

The first sampler 161 may sample and output the first comparison selection signal CSEL1 in synchronization with edges of the third clock signal CK3. The second sampler 162 may sample and output the second comparison selection signal CSEL2 in synchronization with the edges of the third clock signal CK3.

The subtractor 163 may generate a difference value DIFF between the first comparison selection signal CSEL1 and the second comparison selection signal CSEL2 based on the outputs of the first sampler 161 and the second sampler 162. The comparator 164 may compare the difference value DIFF with a reference value RNG to generate the comparison alarm signal CMPALM.

The comparison circuit 160 may generate the comparison alarm signal CMPALM having a pass value when the difference value DIFF is equal to or smaller than the reference value RNG, and may generate the comparison alarm signal CMPALM having a fail value when the difference value DIFF is greater than the reference value RNG. For example, the comparison alarm signal CMPALM may be a one-bit signal having a logic high level (e.g., a value of 1) or a logic low level (e.g., a value of 0). One of the logic high level and the logic low level may correspond to the pass value and the other of the logic high level and the logic low level may correspond to the fail value.

The reference value RNG may be provided from an external device or may be provided from the control logic in the built-in self-test circuit 2000 of FIG. 1 under control of the external device. In some example embodiments, the reference value RNG during the monitor test operation may be set to be smaller than the reference value RNG during the real-time monitoring operation. In case of the real-time monitoring operation, the second comparison selection signal CSEL2 corresponds to the digital output signal DOUT, which is generated through the conversion operation of the digital-to-analog converter 10 and the conversion operation of the analog-to-digital converter 20, and the reference value RNG may be set to a relatively greater value. In contrast, in case of the monitor test operation, the first comparison selection signal CSEL1 and the second comparison selection signal CSEL2 correspond to the digital test signal DTST, which are not generated through the conversion operations of the digital-to-analog converter 10 and the analog-to-digital converter 20, and the reference value RNG may be set to a relatively smaller value.

Figure 7:
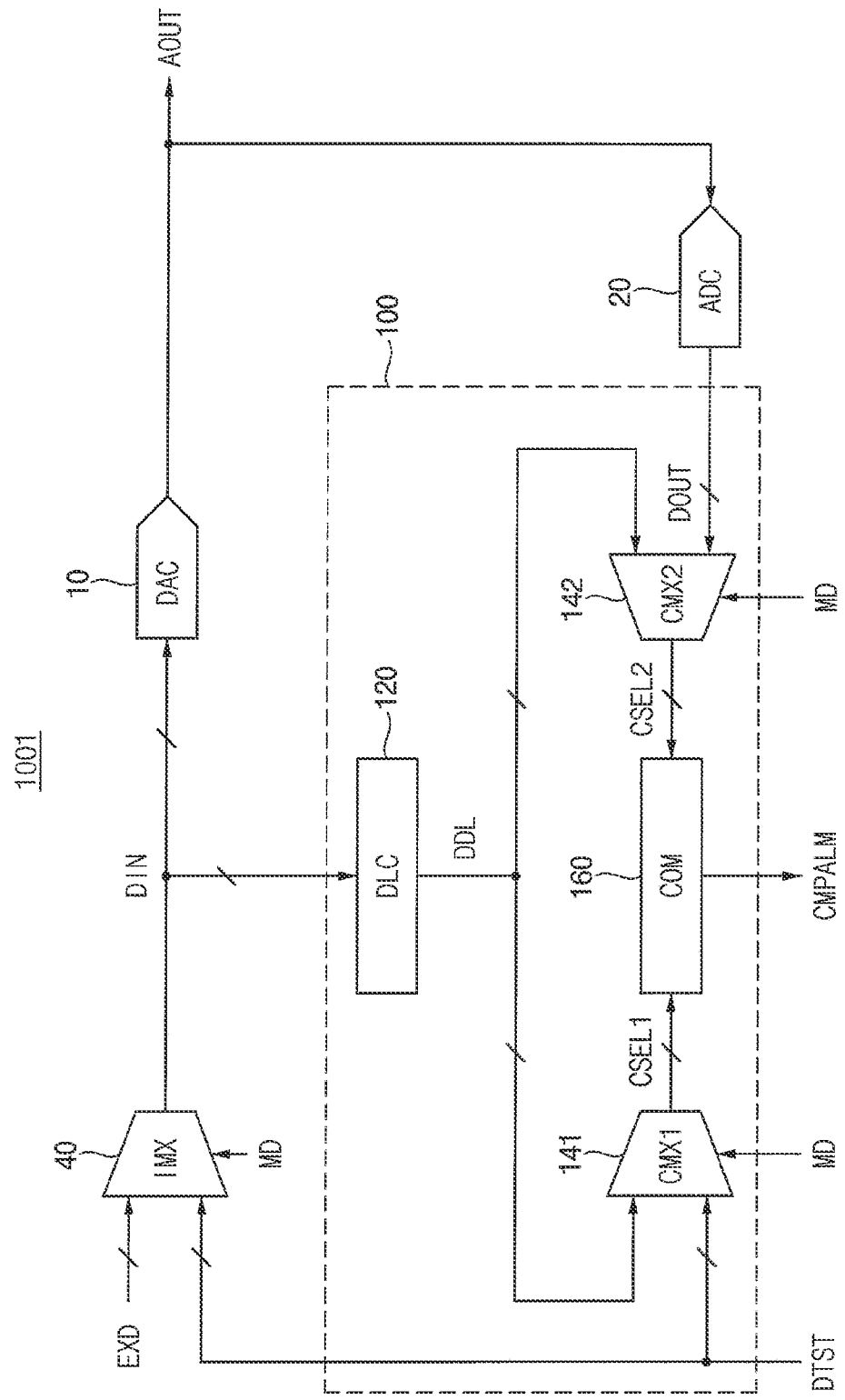
FIG. 7 is a block diagram illustrating a semiconductor integrated circuit according to example embodiments.

FIG. 7 is a block diagram illustrating a semiconductor integrated circuit according to example embodiments.

Referring to FIG. 7, a semiconductor integrated circuit 1001 may include a digital-to-analog converter DAC 10, an analog-to-digital converter ADC 20 and an on-time monitor 100. The on-time monitor 100 may include a delay circuit DLC 120, a first comparison multiplexer CMX1 141, a second comparison multiplexer CMX2 142 and a comparison circuit COM 160. As described with reference to FIG. 5, the delay circuit 120 may include the monitor retiming circuit 122 and the delay unit 124.

FIG. 7 illustrates only the components for describing the real-time monitoring operation and the monitor test operation according to example embodiments for convenience of illustration, and repeated descriptions with respect to FIGS. 1 through 6 may be omitted.

Hereinafter, the real-time monitoring operation is described with reference to FIGS. 8 through 14 and the monitor test operation is described with reference to FIGS. 17 through 21, based on the configuration of the semiconductor integrated circuit 1001 of FIG. 7, but example embodiments are limited to the configuration of FIG. 7.

Figure 8:
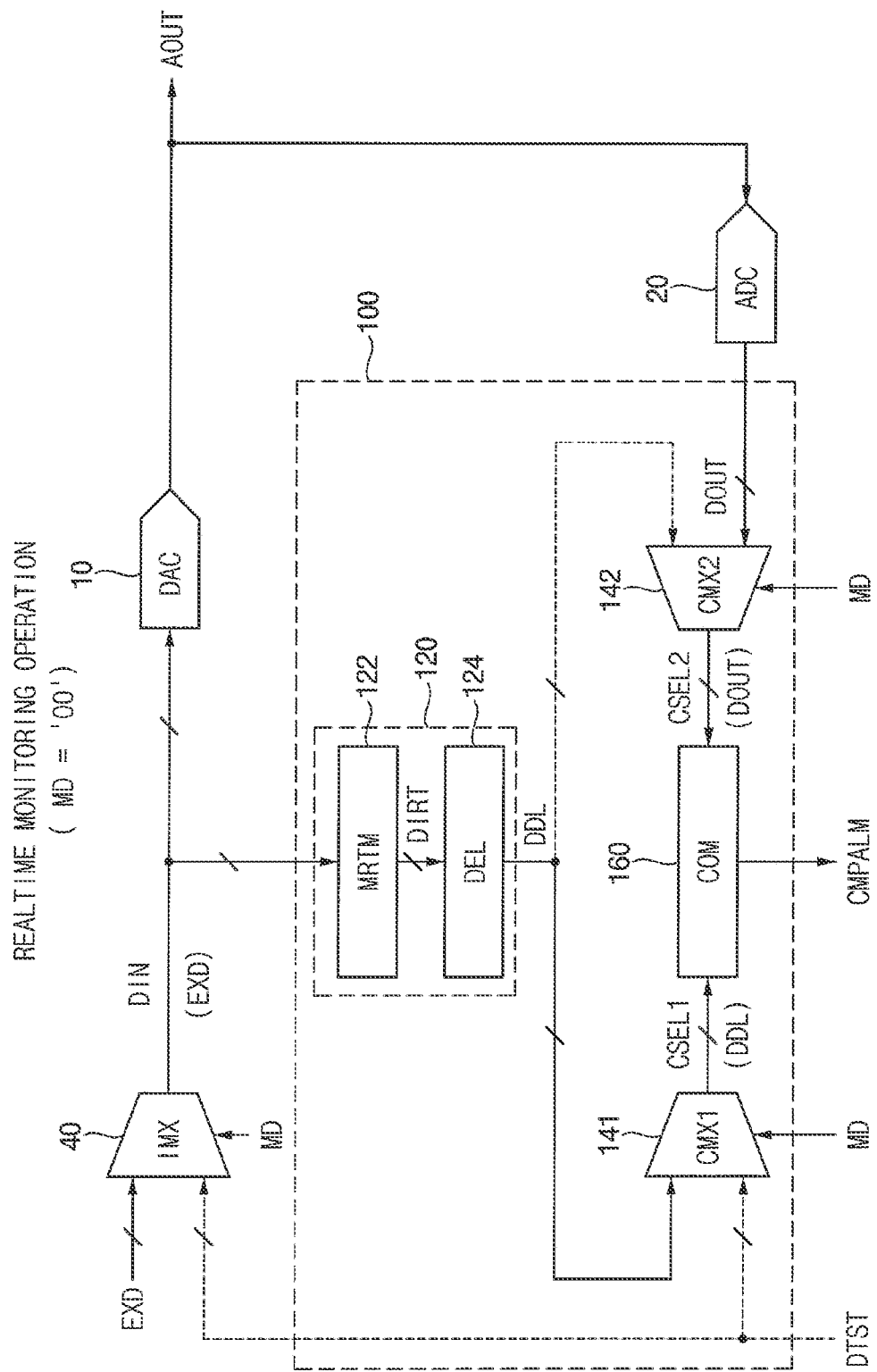
FIG. 8 is a diagram illustrating a signal path corresponding to a real-time monitoring operation in the semiconductor integrated circuit of FIG. 7.

FIG. 8 is a diagram illustrating a signal path corresponding to a real-time monitoring operation in the semiconductor integrated circuit of FIG. 7.

In FIG. 8, enabled signal paths are represented by bolded lines and disabled signal paths are represented by dotted lines, when the mode signal MD indicates the real-time monitoring operation. For example, the mode signal MD may be a two-bit signal, and a first value (e.g., '00') of the mode signal MD may indicate the real-time monitoring operation.

The input multiplexer 40 may output the digital input signal DIN corresponding to the external digital signal EXD by selecting the external digital signal EXD among the external digital signal EXD and the digital test signal DTST in response to the first value '00' of the mode signal MD.

The first comparison multiplexer 141 may output the first comparison selection signal CSEL1 corresponding to the digital delay signal DDL by selecting the digital delay signal DDL among the digital delay signal DDL and the digital test signal DTST in response to the first value '00' of the mode signal MD. The second comparison multiplexer 142 may output the second comparison selection signal CSEL2 corresponding to the digital output signal DOUT by selecting the digital output signal DOUT among the digital delay signal DDL and the digital output signal DOUT in response to the first value '00' of the mode signal MD.

The comparison circuit 160 may generate the comparison alarm signal CMPALM by comparing the first comparison selection signal CSEL1 corresponding to the digital delay signal DDL and the second comparison selection signal CSEL2 corresponding to the digital output signal DOUT such that the comparison alarm signal CMPALM may indicate whether the digital-to-analog converter 10 operates normally.

Figure 9:
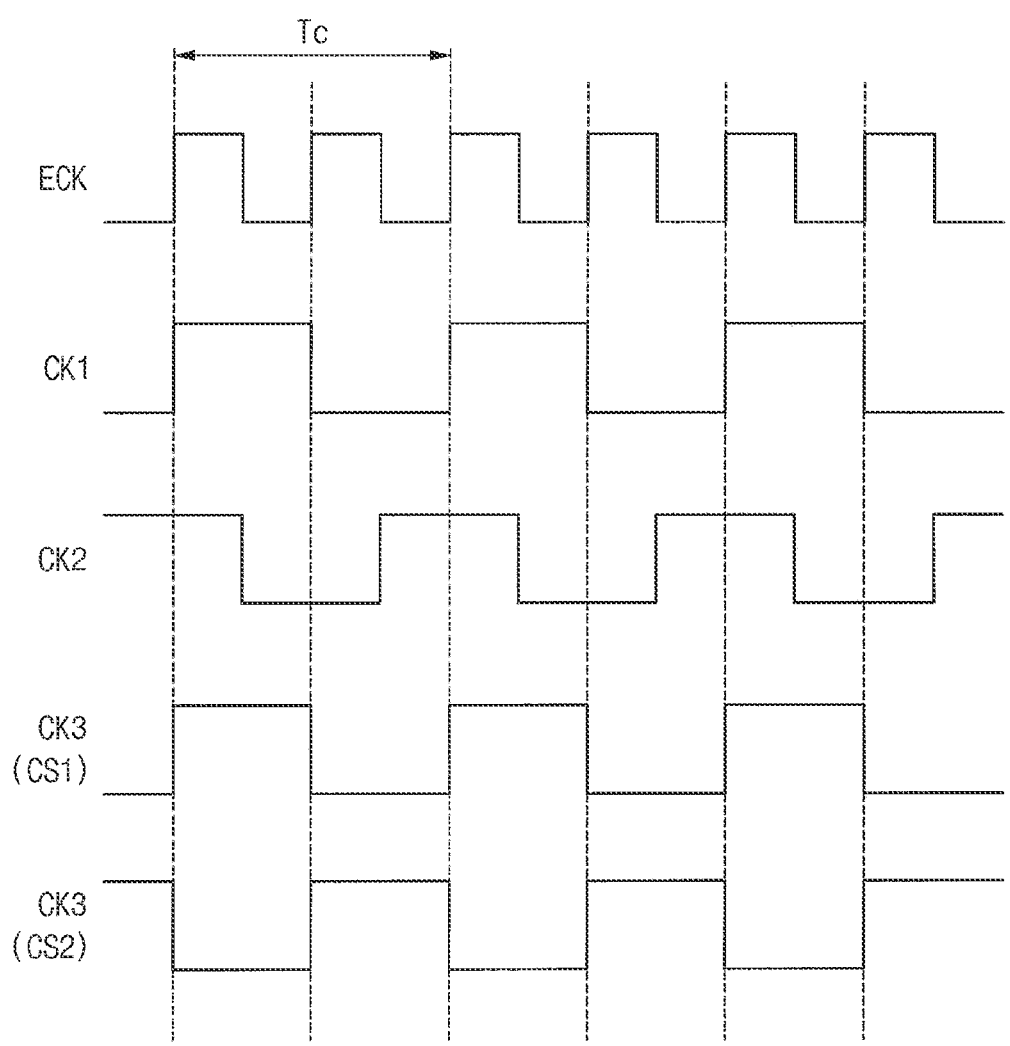
FIG. 9 is a timing diagram illustrating an example embodiment of clock signals used in the semiconductor integrated circuit of FIG. 7.

FIG. 9 is a timing diagram illustrating an example embodiment of clock signals used in the semiconductor integrated circuit of FIG. 7.

As described above, the clock divider 30 in FIG. 1 may generate the first clock signal CK1 having the first frequency and provided to the digital-to-analog converter 10, the second clock signal CK2 having the second frequency and provided to the analog-to-digital converter 20, and the third clock signal CK3 having the second frequency and provided to the comparison circuit 160. In addition, the second clock signal CK2 may be provided to the delay circuit 120 for synchronization of the digital delay signal DDL and the digital output signal DOUT. In FIG. 9, Tc indicates a clock cycle corresponding to the second frequency of the second clock signal CK2 and the third clock signal CK3.

Referring to FIG. 9, the first frequency of the first clock signal CK1 may be equal to the second frequency of the second and third clock signals CK2 and CK3. A phase difference between the first clock signal CK1 and the second clock signal CK2 may be 90 degrees, and a phase difference between the first clock signal CK1 and the third clock signal CK3 may be zero as a first case CS1 or 180 degrees as a second case CS2. FIG. 9 illustrates an example in which the second clock signal CK2 precedes the first clock signal CK1 by 90 degrees. In some example embodiments, the second clock signal CK2 may lag behind the first clock signal CK1 by 90 degrees.

Figure 10:
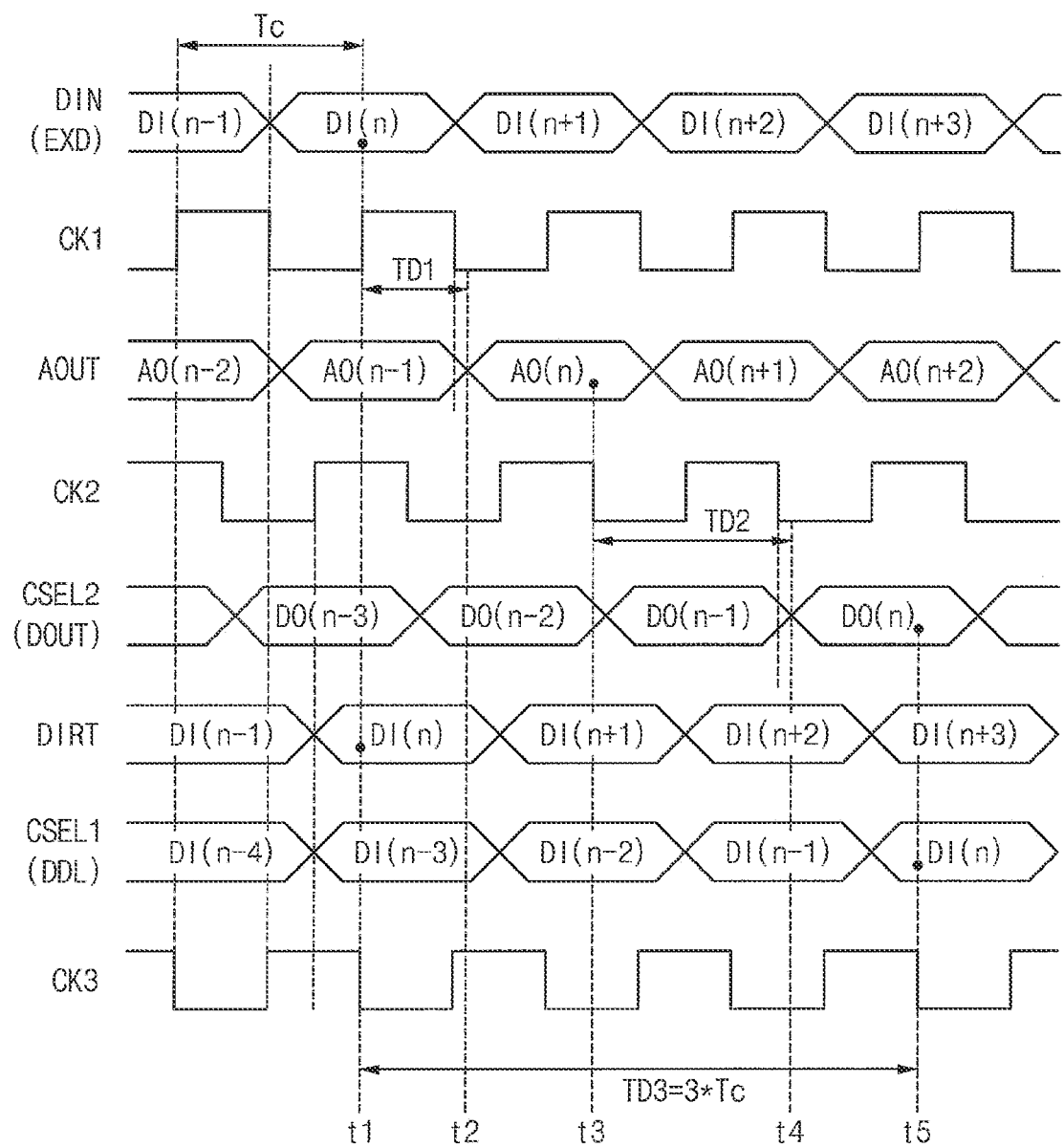
FIGS. 10 and 11 are timing diagrams illustrating operations performed using the clock signals of FIG. 9 in the semiconductor integrated circuit of FIG. 7.
Figure 11:
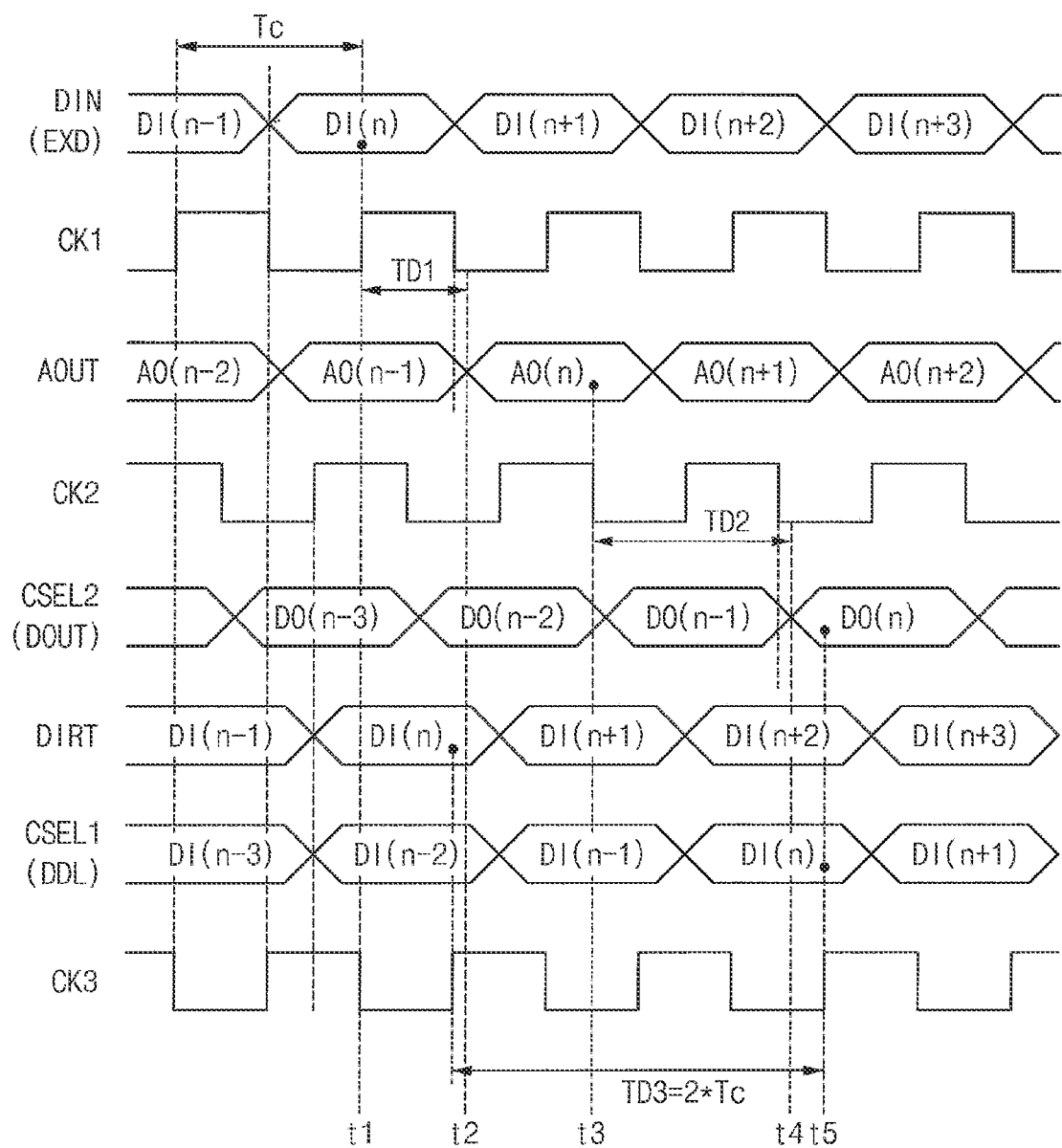

FIGS. 10 and 11 are timing diagrams illustrating operations performed using the clock signals of FIG. 9 in the semiconductor integrated circuit of FIG. 7.

Referring to FIGS. 8, 9, 10 and 11, the input multiplexer 40 may output the external digital signal EXD sequentially including digital data DI(i) (where i is an integer) as the digital input signal DIN in response to the first value '00' of the mode signal MD.

The digital-to-analog converter 10 may sample the digital data DI(i) of the digital input signal DIN at the rising edges of the first clock signal CK1 and may perform the conversion operation to generate the analog output signal AOUT sequentially including analog data AO(i). For example, the digital-to-analog converter 10 may sample the n-th digital data DI(n) of the digital input signal DIN at a first time point t1 and output the n-th analog data AO(n) of the analog output signal AOUT at a second time point t2. The time difference between the first time point t1 and the second time point t2 corresponds to a digital delay amount TD1 of the digital-to-analog converter 10. FIGS. 10 and 11 illustrate an example in which the digital delay amount TD1 of the digital-to-analog converter 10 is slightly longer than a half of the clock cycle Tc.

The analog-to-digital converter 20 may sample the analog data AO(i) of the analog output signal AOUT at the falling edges of the second clock signal CK2 and may perform the conversion operation to generate the digital output signal DOUT sequentially including the digital data DO(i). For example, the analog-to-digital converter 20 may sample the n-th analog data AO(n) of the analog output signal AOUT at a third time point t3 and output the n-th digital data DO(n) of the digital output signal DOUT at a fourth time point t4. The time difference between the third time point t3 and the fourth time point t4 corresponds to an analog delay amount TD2 of the analog-to-digital converter 20. FIGS. 10 and 11 illustrate an example in which the analog delay amount TD2 of the analog-to-digital converter 20 is slightly longer than the clock cycle Tc.

The monitor retiming circuit 122 may generate the retimed digital signal DIRT by synchronizing the digital input signal DIN with the rising edges of the second clock signal CK2. The delay unit 124 may generate the digital delay signal DDL by delaying the retimed digital signal DIRT by a synchronization delay amount TD3. The first comparison multiplexer 141 may select and output the digital delay signal DDL as the first comparison selection signal CSEL1 in response to the first value '00' of the mode signal MD. The second comparison multiplexer 142 may select and output the digital output signal DOUT as the second comparison selection signal CSEL2 in response to the first value '00' of the mode signal MD.

The comparison circuit 160 may sample two corresponding data respectively included in the digital output signal DOUT and the digital delay signal DDL and determine the pass value or the fail value of the comparison alarm signal CMPALM by comparing the two sampled data. To sample the two corresponding data by the comparison circuit 160, the synchronization delay amount TD3 may be determined based on the digital delay amount TD1 of the digital-to-analog converter 10 and the analog delay amount TD2 of the analog-to-digital converter 20.

In some example embodiments, as illustrated in FIG. 10, the comparison circuit 160 may sample the first comparison selection signal CSEL1 and the second comparison selection signal CSEL2 at the falling edges of the third clock signal CK3. In this case, the two corresponding data may be sampled respectively from the digital output signal DOUT and the digital delay signal DDL by setting the synchronization delay amount TD3 to be 3*Tc.

In some example embodiments, as illustrated in FIG. 11, the comparison circuit 160 may sample the first comparison selection signal CSEL1 and the second comparison selection signal CSEL2 at the rising edges of the third clock signal CK3. In this case, the two corresponding data may be sampled respectively from the digital output signal DOUT and the digital delay signal DDL by setting the synchronization delay amount TD3 to be 2*Tc.

For example, as illustrated in FIGS. 10 and 11, the n-th digital data DI(n) of the digital delay signal DDL and the corresponding n-th digital data DO(n) of the digital output signal DOUT may be sampled simultaneously at a fifth time point t5.

Figure 12:
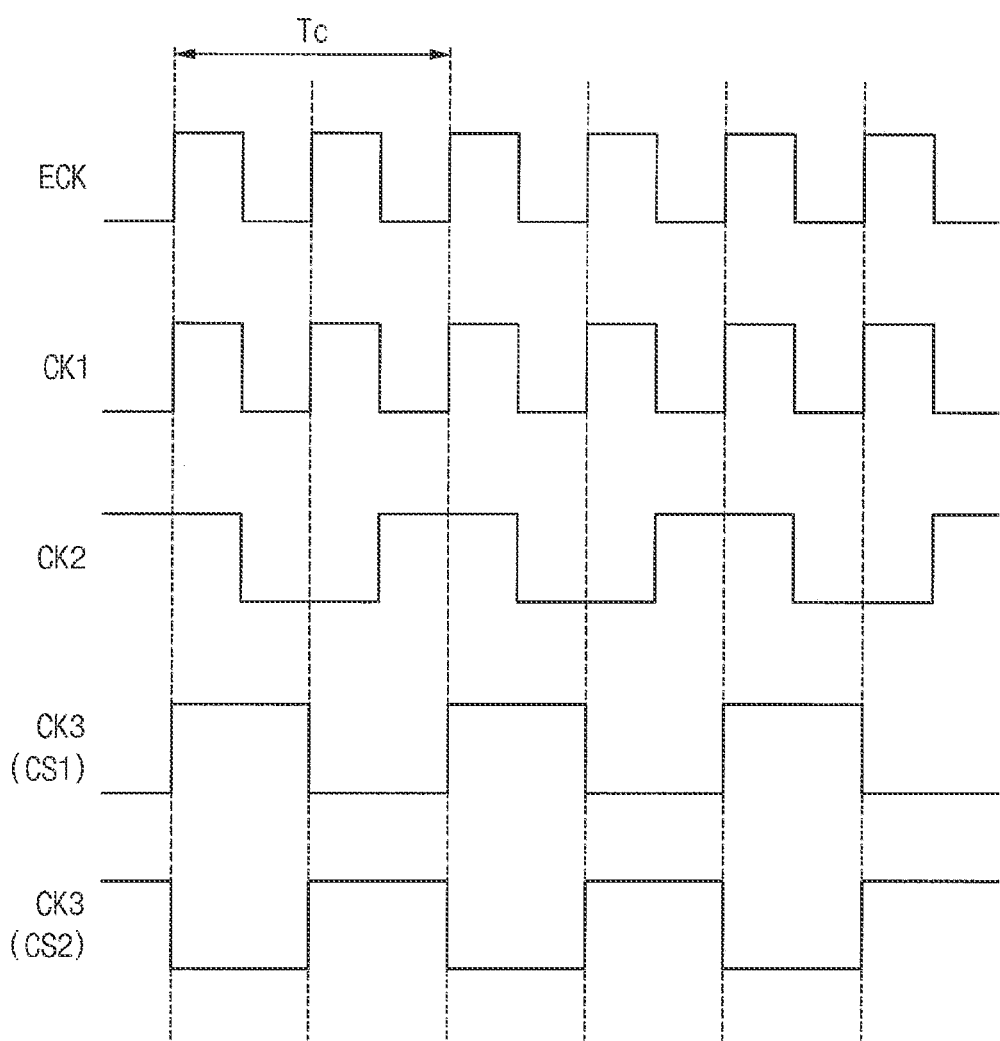
FIG. 12 is a timing diagram illustrating an example embodiment of clock signals used in the semiconductor integrated circuit of FIG. 7.

FIG. 12 is a timing diagram illustrating an example embodiment of clock signals used in the semiconductor integrated circuit of FIG. 7.

As described above, the clock divider 30 in FIG. 1 may generate the first clock signal CK1 having the first frequency and provided to the digital-to-analog converter 10, the second clock signal CK2 having the second frequency and provided to the analog-to-digital converter 20, and the third clock signal CK3 having the second frequency and provided to the comparison circuit 160. In addition, the second clock signal CK2 may be provided to the delay circuit 120 for synchronization of the digital delay signal DDL and the digital output signal DOUT. In FIG. 12, Tc indicates a clock cycle corresponding to the second frequency of the second clock signal CK2 and the third clock signal CK3.

Referring to FIG. 12, the first frequency of the first clock signal CK1 may be twice the second frequency of the second and third clock signals CK2 and CK3. A phase difference between the second clock signal CK2 and the third clock signal CK3 may be 90 degrees. According to example embodiments, the third clock signal CK3 may lag behind the second clock signal CK2 by 90 degrees as a first case CS1, or the third clock signal CK3 may precede the second clock signal CK2 by 90 degrees as a second case CS2. FIG. 12 illustrates an example in which the edges of second clock signal CK2 are synchronized with the falling edges of the first clock signal CK1. In some example embodiments, the edges of the second clock signal CK2 may be synchronized with the rising edges of the first clock signal CK1.

Figure 13:
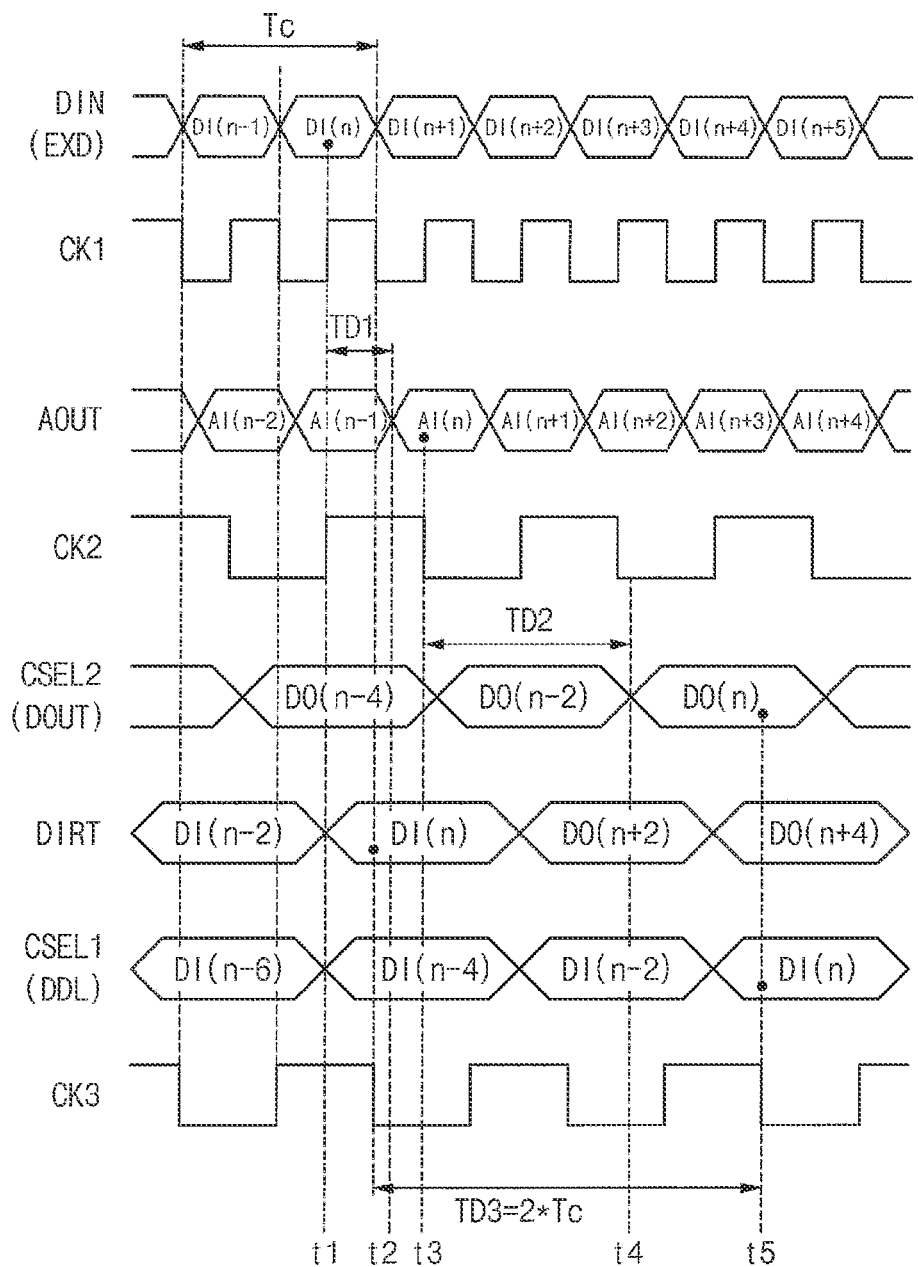
FIGS. 13 and 14 are timing diagrams illustrating operations performed using the clock signals of FIG. 12 in the semiconductor integrated circuit of FIG. 7.
Figure 14:
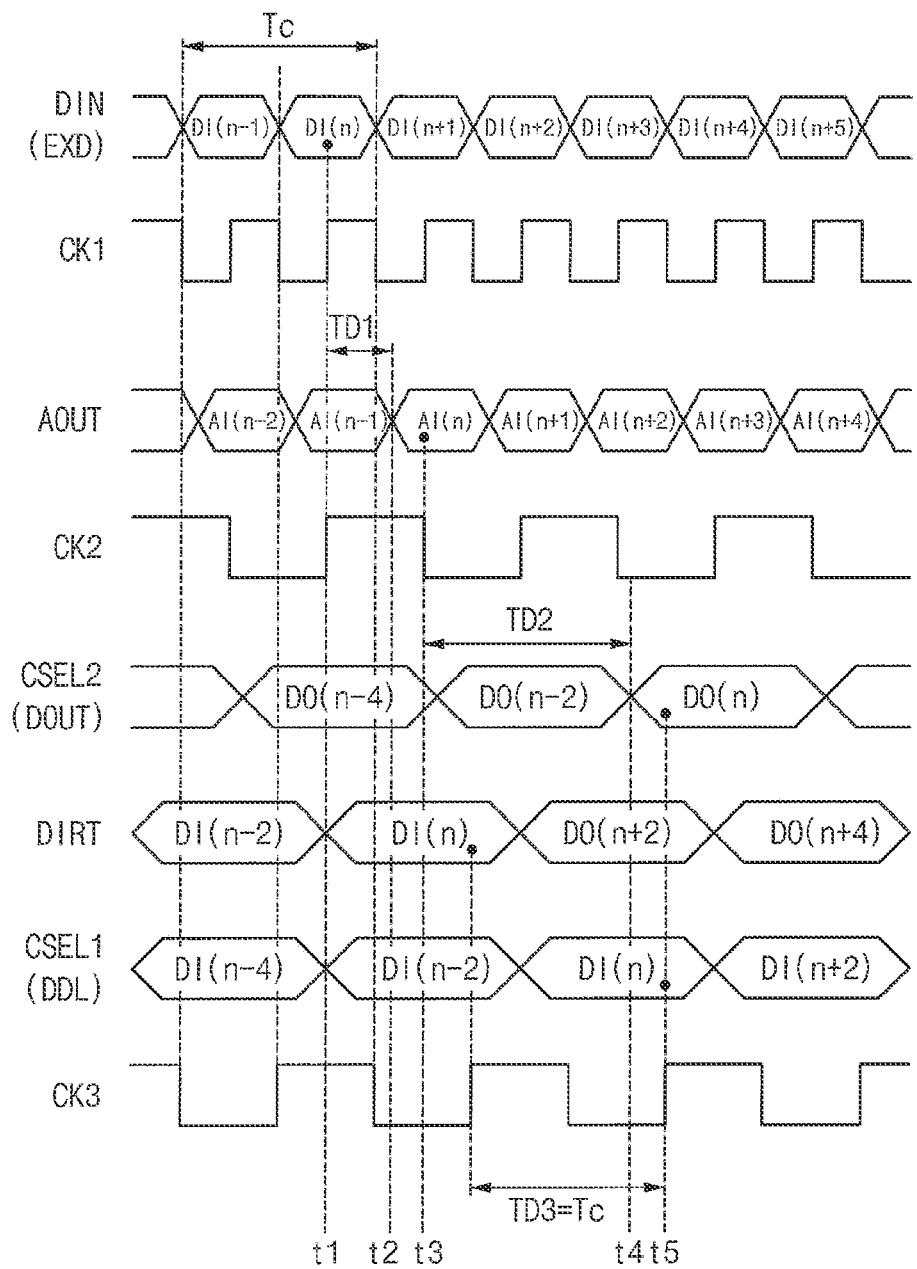

FIGS. 13 and 14 are timing diagrams illustrating operations performed using the clock signals of FIG. 12 in the semiconductor integrated circuit of FIG. 7.

Referring to FIGS. 8, 12, 13 and 14, the input multiplexer 40 may output the external digital signal EXD sequentially including digital data DI(i) (where i is an integer) as the digital input signal DIN in response to the first value '00' of the mode signal MD.

The digital-to-analog converter 10 may sample the digital data DI(i) of the digital input signal DIN at the rising edges of the first clock signal CK1 and may perform the conversion operation to generate the analog output signal AOUT sequentially including analog data AO(i). For example, the digital-to-analog converter 10 may sample the n-th digital data DI(n) of the digital input signal DIN at a first time point t1 and output the n-th analog data AO(n) of the analog output signal AOUT at a second time point t2. The time difference between the first time point t1 and the second time point t2 corresponds to a digital delay amount TD1 of the digital-to-analog converter 10. FIGS. 13 and 14 illustrate an example in which the digital delay amount TD1 of the digital-to-analog converter 10 is slightly longer than a quarter of the clock cycle Tc.

The analog-to-digital converter 20 may sample the analog data AO(i) of the analog output signal AOUT at the falling edges of the second clock signal CK2 and may perform the conversion operation to generate the digital output signal DOUT sequentially including the digital data DO(i). For example, the analog-to-digital converter 20 may sample the n-th analog AO(n) of the analog output signal AOUT at a third time point t3 and output the n-th digital data DO(n) of the digital output signal DOUT at a fourth time point t4. The time difference between the third time point t3 and the fourth time point t4 corresponds to an analog delay amount TD2 of the analog-to-digital converter 20. FIGS. 13 and 14 illustrate an example in which the analog delay amount TD2 of the analog-to-digital converter 20 is slightly longer than the clock cycle Tc.

The monitor retiming circuit 122 may generate the retimed digital signal DIRT by synchronizing the digital input signal DIN with the rising edges of the second clock signal CK2. The delay unit 124 may generate the digital delay signal DDL by delaying the retimed digital signal DIRT by a synchronization delay amount TD3. The first comparison multiplexer 141 may select and output the digital delay signal DDL as the first comparison selection signal CSEL1 in response to the first value '00' of the mode signal MD. The second comparison multiplexer 142 may select and output the digital output signal DOUT as the second comparison selection signal CSEL2 in response to the first value '00' of the mode signal MD.

The comparison circuit 160 may sample two corresponding data respectively included in the digital output signal DOUT and the digital delay signal DDL and determine the pass value or the fail value of the comparison alarm signal CMPALM by comparing the two sampled data. To sample the two corresponding data by the comparison circuit 160, the synchronization delay amount TD3 may be determined based on the digital delay amount TD1 of the digital-to-analog converter 10 and the analog delay amount TD2 of the analog-to-digital converter 20.

In some example embodiments, as illustrated in FIG. 13, the comparison circuit 160 may sample the first comparison selection signal CSEL1 and the second comparison selection signal CSEL2 at the falling edges of the third clock signal CK3. In this case, the two corresponding data may be sampled respectively from the digital output signal DOUT and the digital delay signal DDL by setting the synchronization delay amount TD3 to be 2*Tc.

In some example embodiments, as illustrated in FIG. 14, the comparison circuit 160 may sample the first comparison selection signal CSEL1 and the second comparison selection signal CSEL2 at the rising edges of the third clock signal CK3. In this case, the two corresponding data may be sampled respectively from the digital output signal DOUT and the digital delay signal DDL by setting the synchronization delay amount TD3 to be Tc.

For example, as illustrated in FIGS. 13 and 14, the n-th digital data DI(n) of the digital delay signal DDL and the corresponding n-th digital data DO(n) of the digital output signal DOUT may be sampled simultaneously at a fifth time point t5.

Figure 15:
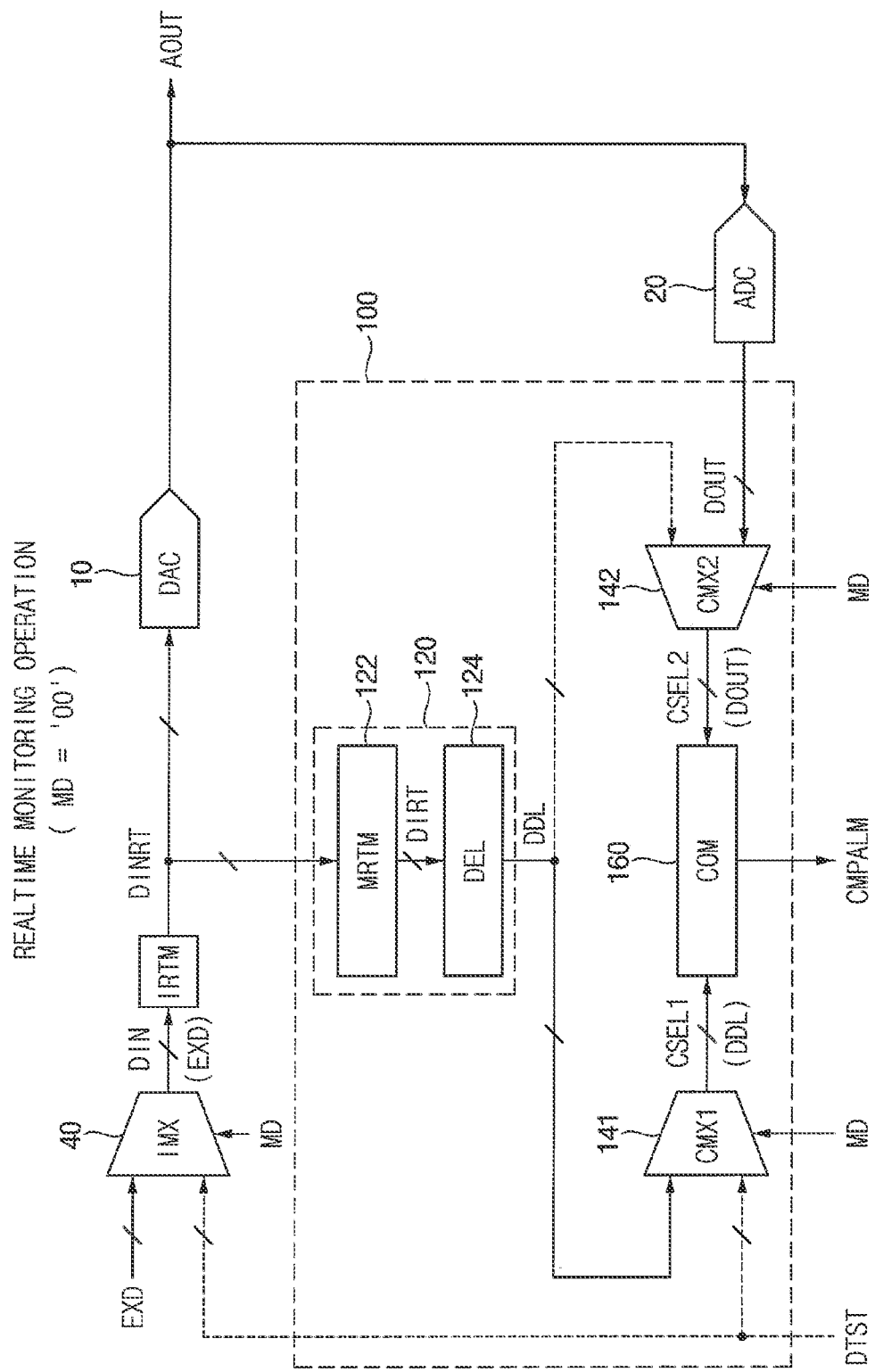
FIG. 15 is a block diagram illustrating a semiconductor integrated circuit according to example embodiments.
Figure 16:
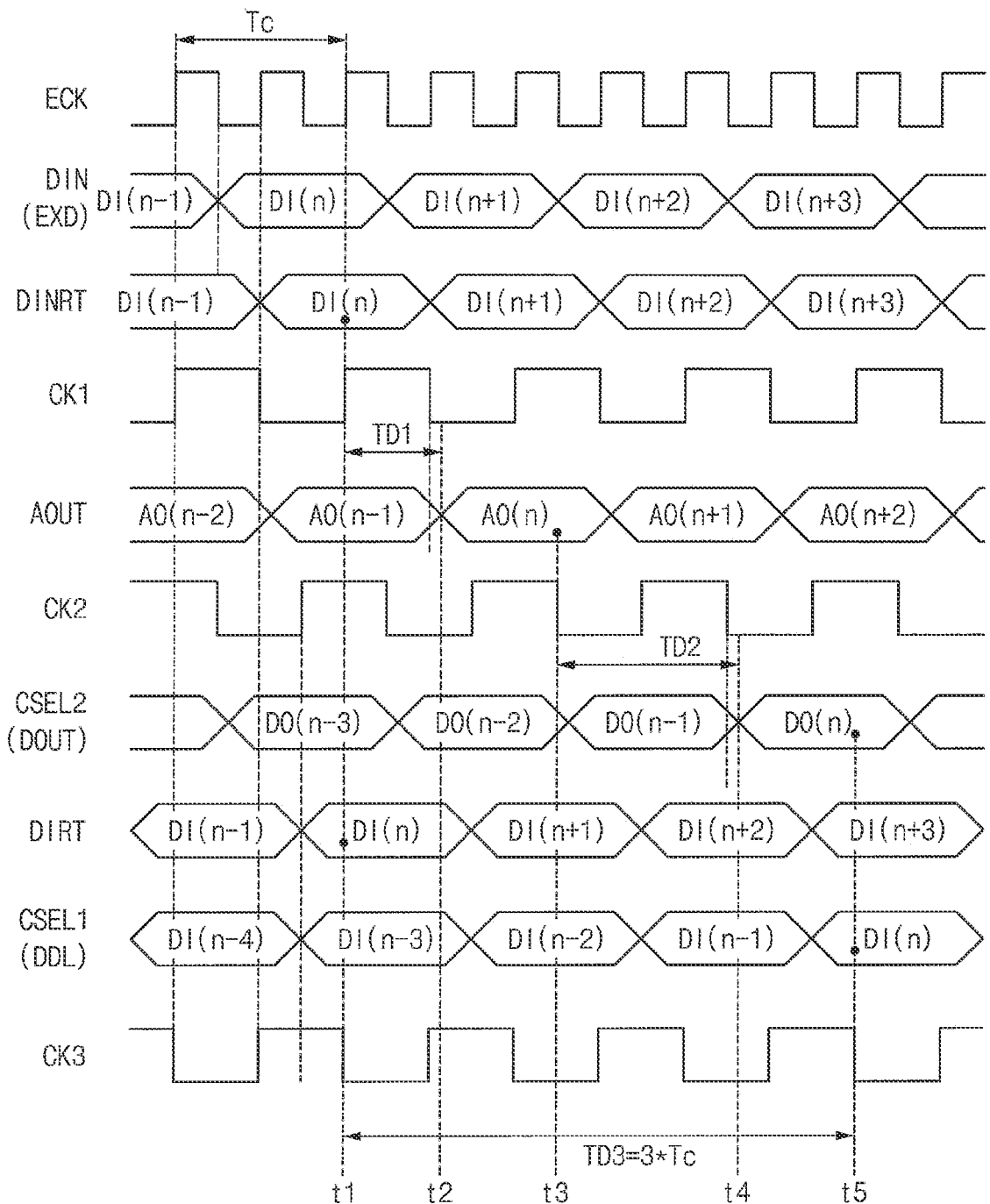
FIG. 16 is a timing diagram illustrating operations performed using the clock signals of FIG. 9 in the semiconductor integrated circuit of FIG. 15.

FIG. 15 is a block diagram illustrating a semiconductor integrated circuit according to example embodiments, and FIG. 16 is a timing diagram illustrating operations performed using the clock signals of FIG. 9 in the semiconductor integrated circuit of FIG. 15.

The semiconductor integrated circuit of FIG. 15 and the enabled signal paths are substantially the same as the semiconductor integrated circuit and the enabled signal paths of FIG. 8, except that the semiconductor integrated circuit of FIG. 15 further includes an input retiming circuit IRTM, and thus repeated descriptions with respect to FIG. 8 may be omitted. In addition, the real-time monitoring operation of the semiconductor integrated circuit of FIG. 15 is substantially the same as described with reference to FIG. 10.

Referring to FIGS. 15 and 16, the clock divider 30 in FIG. 1 may generate the first clock signal CK1 such that the first frequency of the first clock signal CK1 is half the frequency of the external clock signal ECK and the edges of the first clock signal CK1 are synchronized with the rising edges of the external clock signal ECK.

For example, as illustrated in FIG. 16, the external digital signal EXD may be provided from an external device to the semiconductor integrated circuit such that the external digital signal EXD is synchronized with the falling edges of the external clock signal ECK.

The input retiming circuit IRTM may generate a retimed digital input signal DINTR by synchronizing the digital input signal DIN corresponding to the external digital signal EXD with the falling edges of the first clock signal CK1.

Because the clock divider 30 divides the frequency of the external clock signal ECK to generate the first clock signal CK1 inside the semiconductor integrated circuit, the data of the digital input signal DIN may be distorted at the rising edges of the first clock signal CK1 if the external digital signal EXD is aligned to the rising edges of the external clock signal ECK by the external device. To reduce/prevent the data distortion, the input retiming circuit IRTM in FIG. 15 may retime the external digital signal EXD to be synchronized with the falling edges of the first clock signal CK1 and thus the data center of the digital input signal DIN may be aligned to the rising edges of the first clock signal CK1 as illustrated in FIG. 16.

Figure 17:
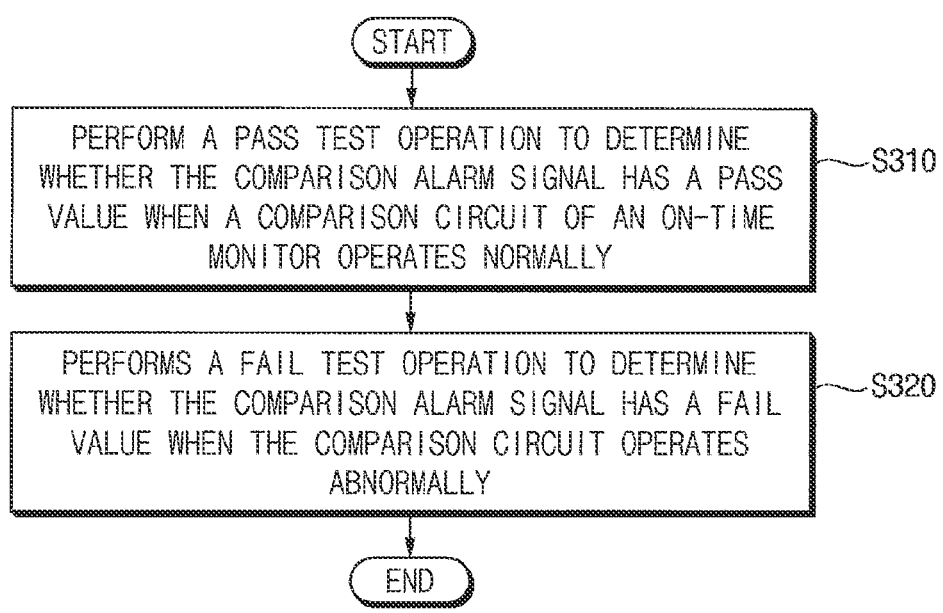
FIG. 17 is a flow chart illustrating a test method using a built-in self-test circuit according to example embodiments.

FIG. 17 is a flow chart illustrating a test method using a built-in self-test circuit according to example embodiments.

Referring to FIG. 17, a pass test operation may be performed to determine whether the comparison alarm signal has a pass value when a comparison circuit of an on-time monitor operates normally (Block S310). In addition, a fail test operation may be performed to determine whether the comparison alarm signal has a fail value when the comparison circuit operates abnormally (Block S320).

As such, the monitor test operation to determine whether the on-time monitor operates normally may include the pass test operation and the fail test operation. Hereinafter, the pass test operation is described with reference to FIGS. 18 and 19, and the fail test operation is described with reference to FIGS. 20 and 21.

Figure 18:
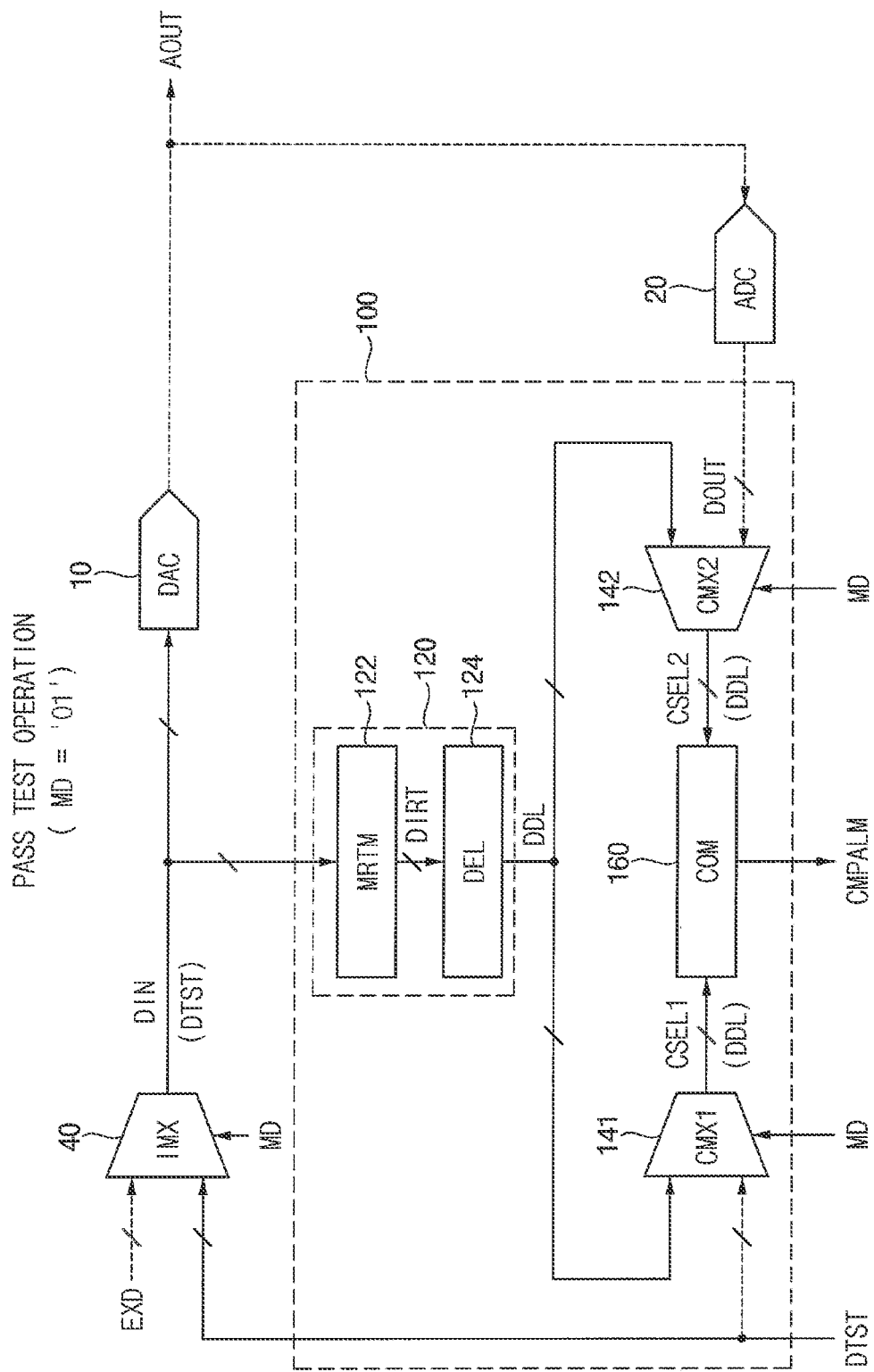
FIG. 18 is a diagram illustrating a signal path corresponding to a pass test operation in the semiconductor integrated circuit of FIG. 7.

FIG. 18 is a diagram illustrating a signal path corresponding to a pass test operation in the semiconductor integrated circuit of FIG. 7.

In FIG. 18, enabled signal paths are represented by bolded lines and disabled signal paths are represented by dotted lines, when the mode signal MD indicates the pass test operation. For example, the mode signal MD may be a two-bit signal, and a second value (e.g., '01') of the mode signal MD may indicate the pass test operation.

The input multiplexer 40 may output digital input signal DIN corresponding to the digital test signal DTST 1 by selecting the digital test signal DTST among the external digital signal EXD and the digital test signal DTST in response to the second value '01' of the mode signal MD.

The first comparison multiplexer 141 may output the first comparison selection signal CSEL1 corresponding to the digital delay signal DDL by selecting the digital delay signal DDL among the digital delay signal DDL and the digital test signal DTST in response to the second value '01' of the mode signal MD. In addition, the second comparison multiplexer 142 may output the second comparison selection signal CSEL2 corresponding to the digital delay signal DDL by selecting the digital delay signal DDL among the digital delay signal DDL and the digital output signal DOUT in response to the second value '01' of the mode signal MD.

The comparison circuit 160 may generate the comparison alarm signal CMPALM by comparing the first comparison selection signal CSEL1 corresponding to the digital delay signal DDL and the second comparison selection signal CSEL2 corresponding to the digital delay signal DDL such that the comparison alarm signal CMPALM may indicate whether the on-time monitor 100 generates the comparison alarm signal CMPALM having the pass value.

Figure 19:
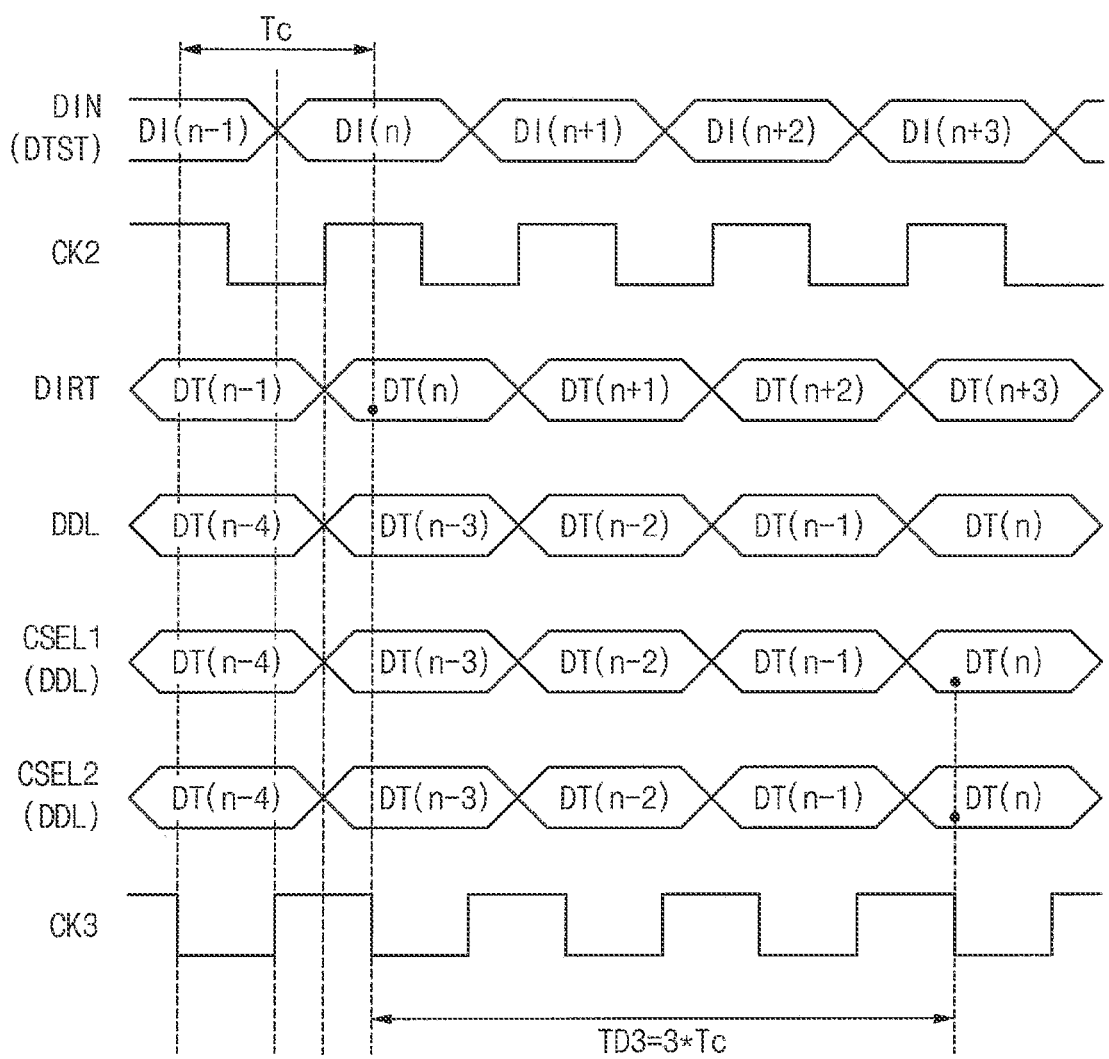
FIG. 19 is a timing diagram illustrating a pass test operation performed using the clock signals of FIG. 9 in the semiconductor integrated circuit of FIG. 7.

FIG. 19 is a timing diagram illustrating a pass test operation performed using the clock signals of FIG. 9 in the semiconductor integrated circuit of FIG. 7.

Referring to FIGS. 18 and 19, the input multiplexer 40 may output the digital test signal DTST sequentially including digital data DT(i) (where i is an integer) as the digital input signal DIN in response to the second value '01' of the mode signal MD.

The monitor retiming circuit 122 may generate the retimed digital signal DIRT by synchronizing the digital input signal DIN corresponding to the digital delay signal DDL with the rising edges of the second clock signal CK2. The delay unit 124 may generate the digital delay signal DDL by delaying the retimed digital signal DIRT by a synchronization delay amount TD3. For example, the synchronization delay amount TD3 may be set to 3*Tc as described with reference to FIG. 10.

The first comparison multiplexer 141 may select and output the digital delay signal DDL as the first comparison selection signal CSEL1 in response to the second value '01' of the mode signal MD. In addition, the second comparison multiplexer 142 may select and output the digital delay signal DDL as the second comparison selection signal CSEL2 in response to the second value '01' of the mode signal MD.

The comparison circuit 160 may sample two corresponding data respectively included in the first comparison selection signal CSEL1 and the second comparison selection signal CSEL2 and determine the pass value or the fail value of the comparison alarm signal CMPALM by comparing the two sampled data.

In some example embodiments, as illustrated in FIG. 19, the comparison circuit 160 may sample the first comparison selection signal CSEL1 and the second comparison selection signal CSEL2 at the falling edges of the third clock signal CK3. For example, the comparison circuit 160 may sample the n-th digital data DT(n) of the first comparison selection signal CSEL1 and the n-th digital data DT(n) of the second comparison selection signal CSEL2 simultaneously at the falling edge of the third clock signal CK3.

As such, because the comparison circuit 160 samples the same data of the digital test signal DTST as the two data to be compared, the comparison alarm signal CMPALM must have the pass value in the pass test operation if the comparison circuit 160 operates normally. It is determined that the comparison circuit 160 operates abnormally if the comparison alarm signal CMPALM has the fail value in the pass test operation.

Figure 20:
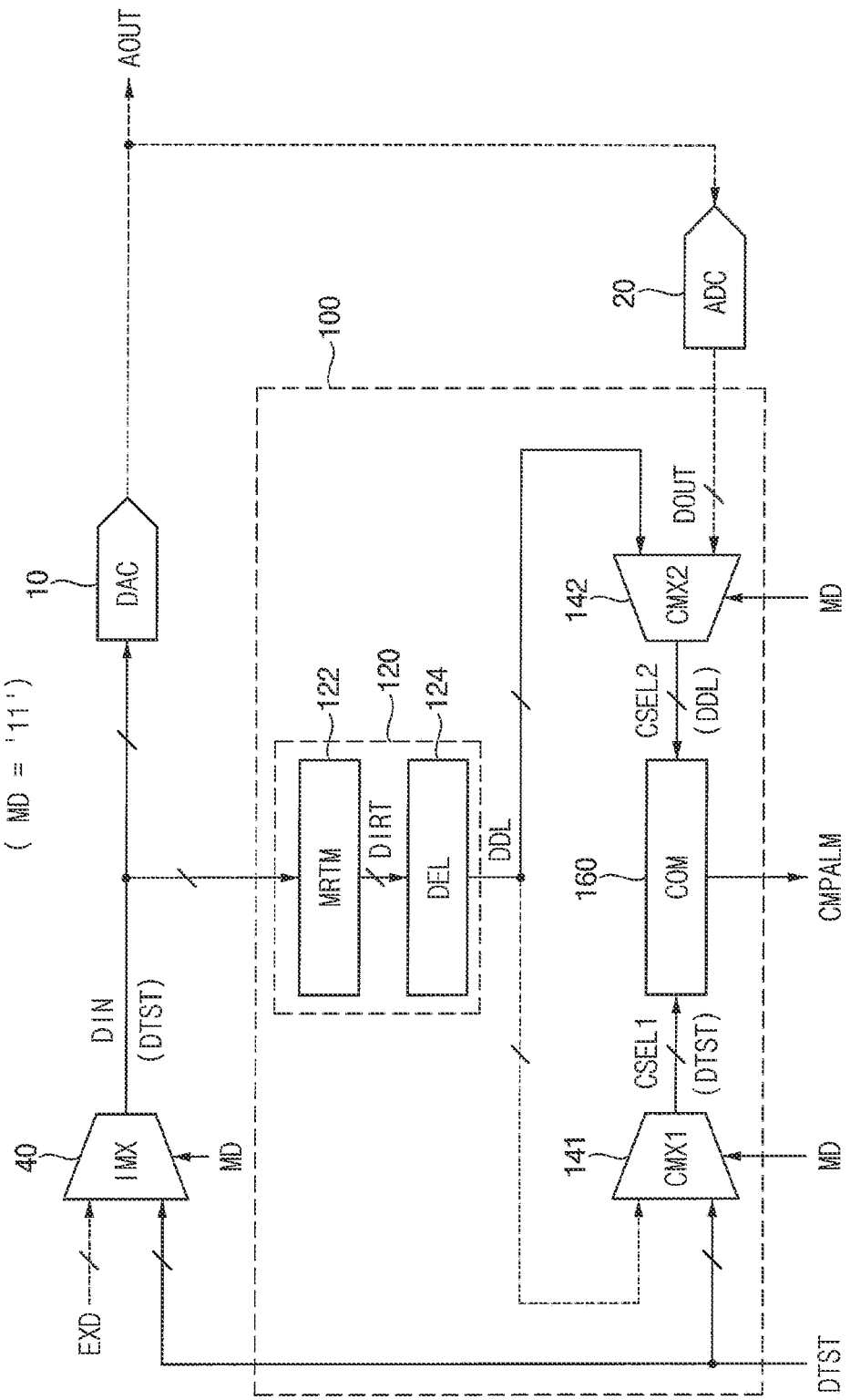
FIG. 20 is a diagram illustrating a signal path corresponding to a fail test operation in the semiconductor integrated circuit of FIG. 7.

FIG. 20 is a diagram illustrating a signal path corresponding to a fail test operation in the semiconductor integrated circuit of FIG. 7.

In FIG. 20, enabled signal paths are represented by bolded lines and disabled signal paths are represented by dotted lines, when the mode signal MD indicates the fail test operation. For example, the mode signal MD may be a two-bit signal, and a third value (e.g., '11') of the mode signal MD may indicate the fail test operation.

The input multiplexer 40 may output digital input signal DIN corresponding to the digital test signal DTST by selecting the digital test signal DTST among the external digital signal EXD and the digital test signal DTST in response to the third value '11' of the mode signal MD.

The first comparison multiplexer 141 may output the first comparison selection signal CSEL1 corresponding to the digital test signal DTST by selecting the digital test signal DTST among the digital delay signal DDL and the digital test signal DTST in response to the third value '11' of the mode signal MD. In contrast, the second comparison multiplexer 142 may output the second comparison selection signal CSEL2 corresponding to the digital delay signal DDL by selecting the digital delay signal DDL among the digital delay signal DDL and the digital output signal DOUT in response to the third value '11' of the mode signal MD.

The comparison circuit 160 may generate the comparison alarm signal CMPALM by comparing the first comparison selection signal CSEL1 corresponding to the digital test signal DTST and the second comparison selection signal CSEL2 corresponding to the digital delay signal DDL such that the comparison alarm signal CMPALM may indicate whether the on-time monitor 100 generates the comparison alarm signal CMPALM having the fail value.

Figure 21:
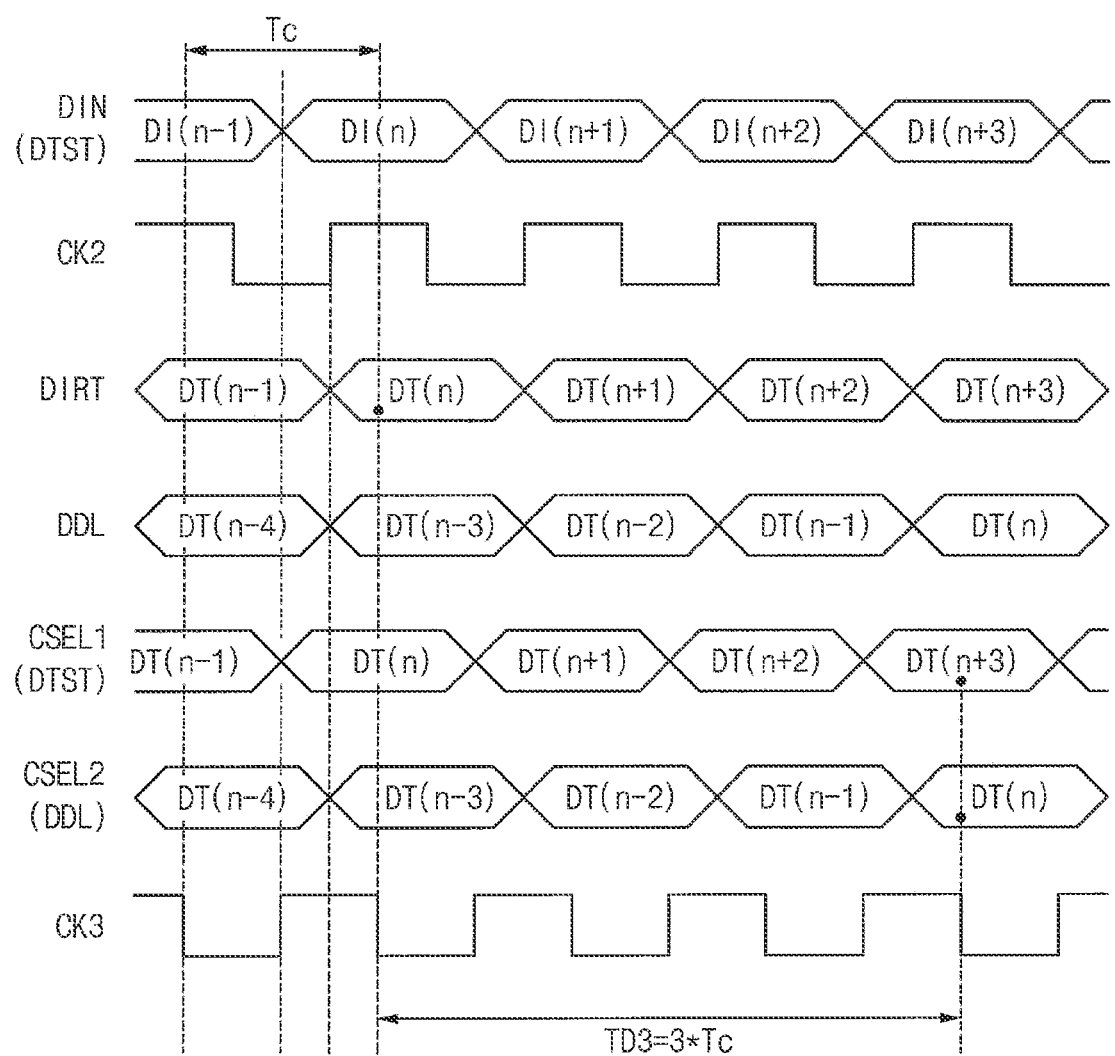
FIG. 21 is a timing diagram illustrating a fail test operation performed using the clock signals of FIG. 9 in the semiconductor integrated circuit of FIG. 7.

FIG. 21 is a timing diagram illustrating a fail test operation performed using the clock signals of FIG. 9 in the semiconductor integrated circuit of FIG. 7.

Referring to FIGS. 20 and 21, the input multiplexer 40 may output the digital test signal DTST sequentially including digital data DT(i) (where i is an integer) as the digital input signal DIN in response to the third value '11' of the mode signal MD.

The monitor retiming circuit 122 may generate the retimed digital signal DIRT by synchronizing the digital input signal DIN corresponding to the digital delay signal DDL with the rising edges of the second clock signal CK2. The delay unit 124 may generate the digital delay signal DDL by delaying the retimed digital signal DIRT by a synchronization delay amount TD3. For example, the synchronization delay amount TD3 may be set to 3*Tc as described with reference to FIG. 10.

The first comparison multiplexer 141 may select and output the digital test signal DTST as the first comparison selection signal CSEL1 in response to the third value '11' of the mode signal MD. In contrast, the second comparison multiplexer 142 may select and output the digital delay signal DDL as the second comparison selection signal CSEL2 in response to the third value '11' of the mode signal MD.

The comparison circuit 160 may sample two corresponding data respectively included in the first comparison selection signal CSEL1 and the second comparison selection signal CSEL2 and determine the pass value or the fail value of the comparison alarm signal CMPALM by comparing the two sampled data.

In some example embodiments, as illustrated in FIG. 21, the comparison circuit 160 may sample the first comparison selection signal CSEL1 and the second comparison selection signal CSEL2 at the falling edges of the third clock signal CK3. For example, the comparison circuit 160 may sample the (n+3)-th digital data DT(n+3) of the first comparison selection signal CSEL1 and the n-th digital data DT(n) of the second comparison selection signal CSEL2 simultaneously at the falling edge of the third clock signal CK3.

The digital test signal generator 300 in FIG. 1 may generate the digital test signal DTST such that the (n+3)-th digital data DT(n+3) and the n-th digital data DT(n) of the digital test signal DTST are different from each other during the fail test operation. The difference value of the (n+3)-th digital data DT(n+3) and the n-th digital data DT(n) may be set to be greater than the above-described reference value RNG.

As such, because the comparison circuit 160 samples the different data of the digital test signal DTST as the two data to be compared, the comparison alarm signal CMPALM must have the fail value in the fail test operation if the comparison circuit 160 operates normally. It is determined that the comparison circuit 160 operates abnormally if the comparison alarm signal CMPALM has the pass value in the fail test operation.

As described with reference to FIGS. 17 through 21, the built-in self-test circuit according to example embodiments may further enhance reliability of the digital-to-analog converter and the semiconductor integrated circuit including the digital-to-analog converter by testing abnormality of the on-time monitor.

FIGS. 22 through 26 are block diagrams illustrating a semiconductor integrated circuit according to example embodiments. Hereinafter, repeated descriptions with respect to FIGS. 1 through 21 may be omitted.

Figure 22:
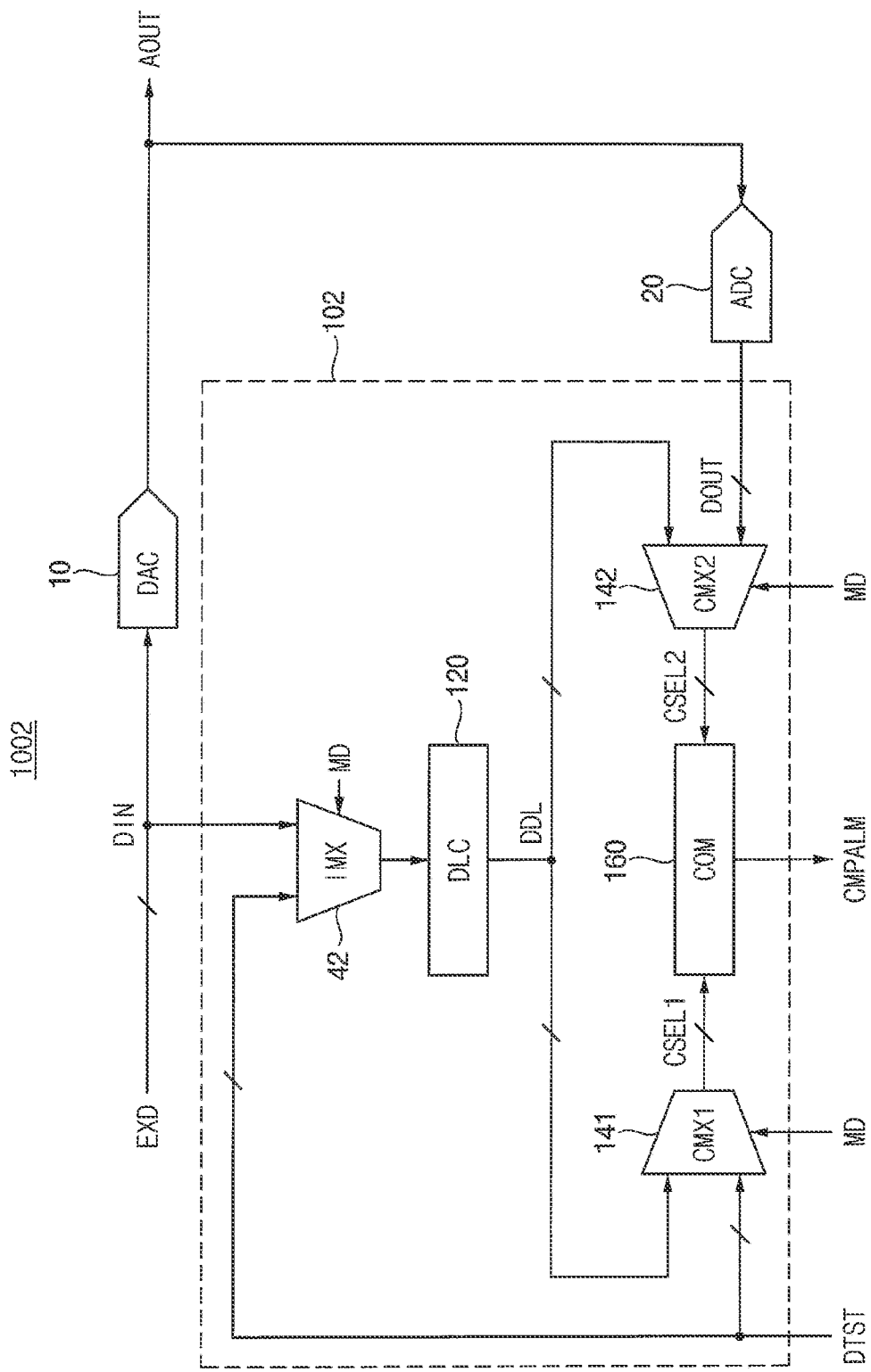
FIGS. 22 through 26 are block diagrams illustrating a semiconductor integrated circuit according to example embodiments.

A semiconductor integrated circuit 1002 of FIG. 22 is substantially the same as the semiconductor integrated circuit 1001 of FIG. 7, except for the location of an input multiplexer 42.

The input multiplexer 42 in FIG. 22 may be disposed inside the on-time monitor 102, whereas the input multiplexer 40 in FIG. 7 is disposed outside the on-time monitor 100. Accordingly, the digital-to-analog converter 10 may receive only the external digital signal EXD in the semiconductor integrated circuit 1002 of FIG. 22, whereas the digital-to-analog converter 10 may receive selectively the external digital signal EXD or the digital test signal DTST in the semiconductor integrated circuit 1001 of FIG. 7.

The input multiplexer 40 of FIG. 7 may provide the digital test signal DTST to the digital-to-analog converter 10 for various tests other than the real-time monitoring operation and the monitor test operation. In contrast, the input multiplexer 42 in FIG. 22 may be used to select only the real-time monitoring operation or the monitor test operation. In some example embodiments, the semiconductor integrated circuit 1002 may further include the input multiplexer 40 as described with reference to FIG. 7 in addition to the input multiplexer 42 in FIG. 22.

Figure 23:
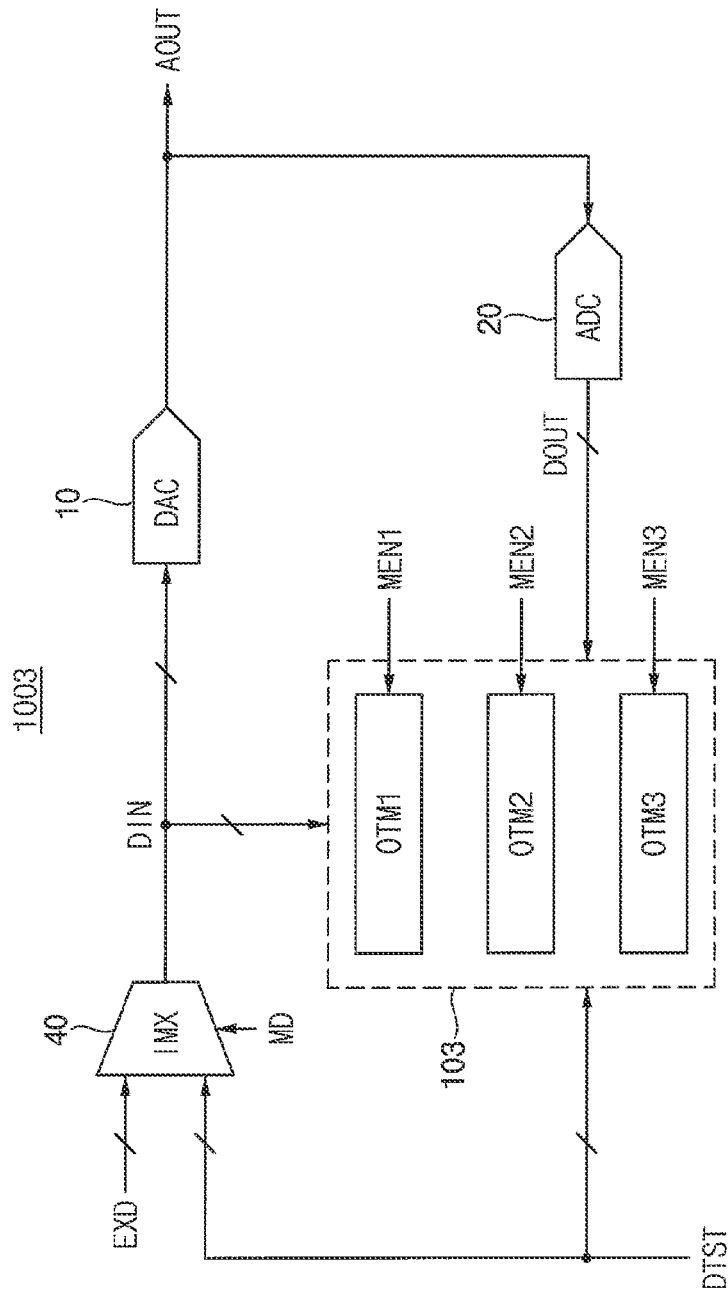

Referring to FIG. 23, a semiconductor integrated circuit 1003 may include a plurality of on-time monitors 103, such as, for example, three on-time monitors OTM1, OTM2 and OTM3 that are connected in parallel to the digital-to-analog converter 10 and the analog-to-digital converter 20.

The built-in self-test circuit of the semiconductor integrated circuit 1003 may perform the monitor test operation as described above to determine whether each of the plurality of on-time monitors OTM1, OTM2 and OTM3 operates normally. The built-in self-test circuit may perform the real-time monitoring operation using one on-time monitor operating normally among the plurality of on-time monitors OTM1, OTM2 and OTM3. The plurality of on-time monitors OTM1, OTM2 and OTM3 may be enabled based on a plurality of monitor enable signals MEN1, MEN2 and MEN3, respectively. The control logic 200 in FIG. 1 may activate the one monitor enable signal corresponding to the on-time monitor that is determined as operating normally by the monitor test operation and deactivate the other monitor enable signals.

Figure 24:
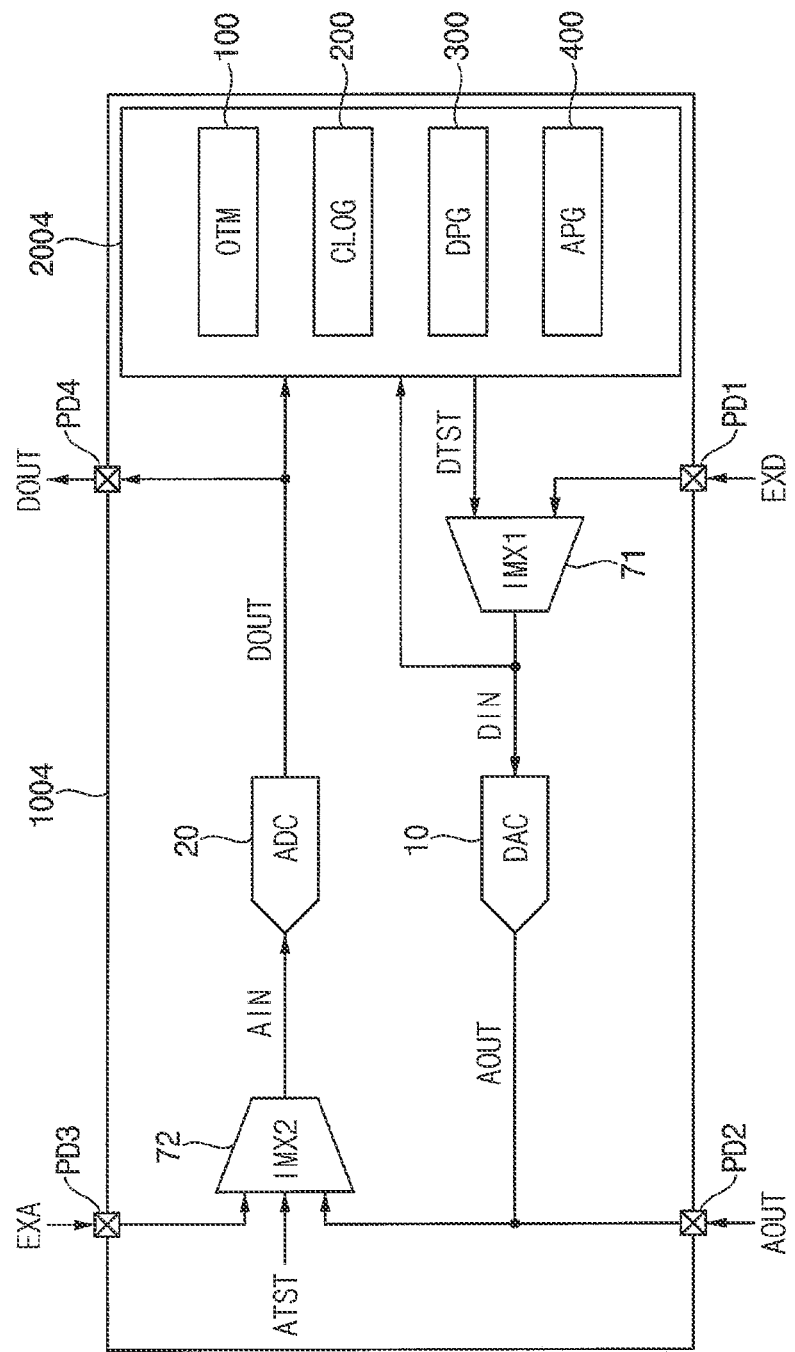

Referring to FIG. 24, a semiconductor integrated circuit 1004 may include a first input multiplexer IMX1 71, a second input multiplexer IMX2 72, a digital-to-analog converter DAC 10, an analog-to-digital converter ADC 20 and a built-in self-test circuit 2004.

The first input multiplexer 71 may output a digital input signal DIN by selecting one of a digital test signal DTST and an external digital signal EXD that is provided through a pad PD1 from an external device outside the semiconductor integrated circuit 1004. The digital-to-analog converter 10 may perform a first normal conversion operation to generate an analog output signal AOUT by converting the digital input signal DIN and provide the analog output signal AOUT corresponding to the external digital signal EXD through a pad PD2 to the external device.

The second input multiplexer 72 may output an analog input signal AIN by selecting one of an analog test signal ATST, the analog output signal AOUT and an external analog signal EXA that is provided through a pad PD3 from the external device. The analog-to-digital converter 20 may perform a second normal conversion operation to generate a digital output signal DOUT by converting the analog input signal AIN and provide the digital output signal DOUT corresponding to the external analog signal EXA through a pad PD4 to the external device.

The built-in self-test circuit 2004 may include an on-time monitor OTM 100, a control logic CLOG 200, and a digital test signal generator DPG 300, as described above. The built-in self-test circuit 2004 may further include an analog test signal generator APG 400 to generate the analog test signal ATST. The analog test signal ATST may be applied to the analog-to-digital converter 20 through the second input multiplexer 72 to perform a test operation with respect to the analog-to-digital converter 20.

The built-in self-test circuit 2004 may, while the digital-to-analog converter 10 performs the first normal conversion operation, perform the real-time monitoring operation as described above to generate the comparison alarm signal based on the digital input signal DIN and the analog output signal AOUT such that the comparison alarm signal indicates whether the digital-to-analog converter 10 operates normally.

The analog-to-digital converter 20 may stop performing the second normal conversion operation while the built-in self-test circuit 2004 performs the real-time monitoring operation or the monitor test operation using the analog-to-digital converter 20.

Figure 25:
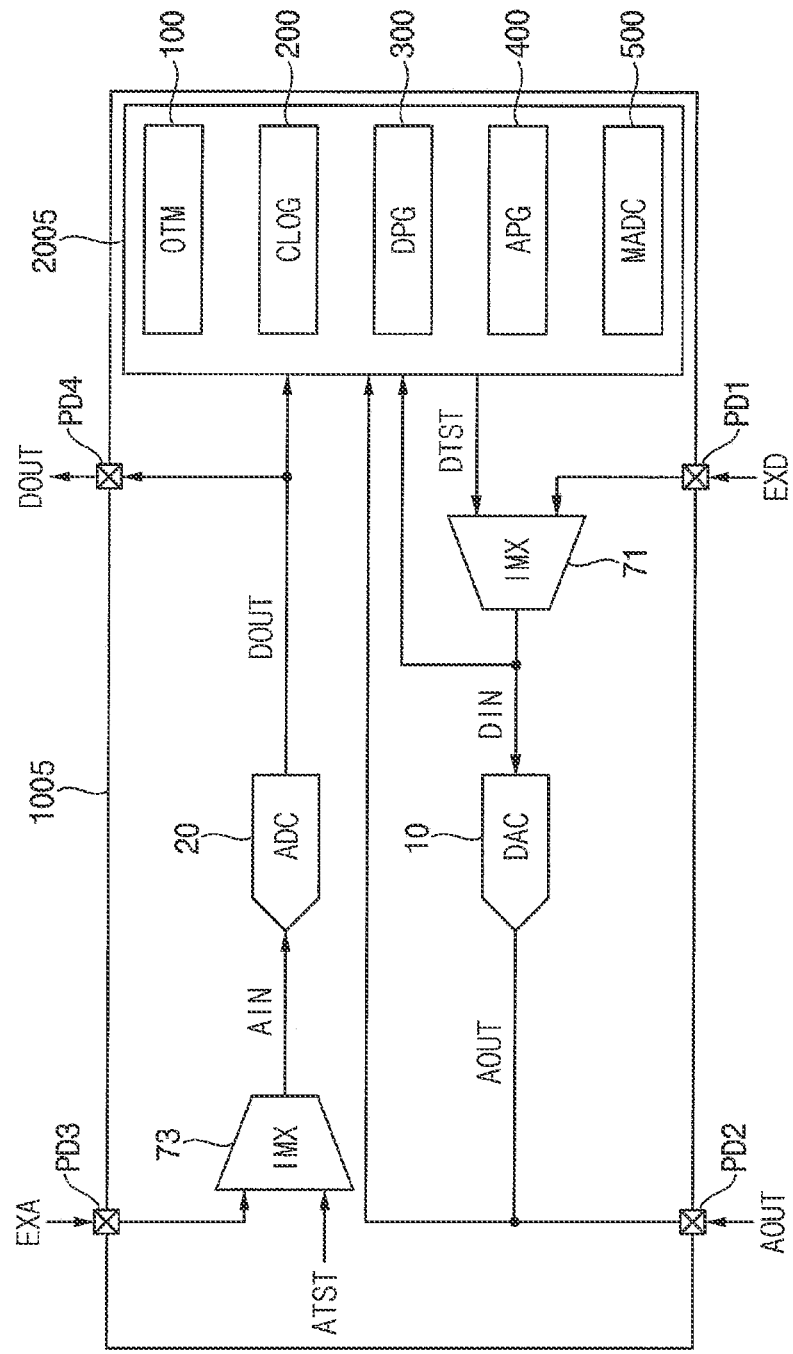

A semiconductor integrated circuit 1005 of FIG. 25 is similar to the semiconductor integrated circuit 1004 of FIG. 24 and repeated descriptions with respect to FIG. 24 may be omitted. In comparison with the second input multiplexer 72 in FIG. 24, the second input multiplexer 73 in FIG. 25 may not receive the analog output signal AOUT generated from the digital-to-analog converter 10 and output the analog input signal AIN by selecting one of the external analog signal EXA and the analog test signal ATST. In addition, in comparison with the built-in self-test circuit 2004 in FIG. 24, the built-in self-test circuit 2005 in FIG. 25 may further include a monitoring analog-to-digital converter MADC 500 for the above-described real-time monitoring operation. In this case, the analog-to-digital converter 20 may perform the second normal conversion operation even while the built-in self-test circuit 2005 performs the real-time monitoring operation.

Figure 26:
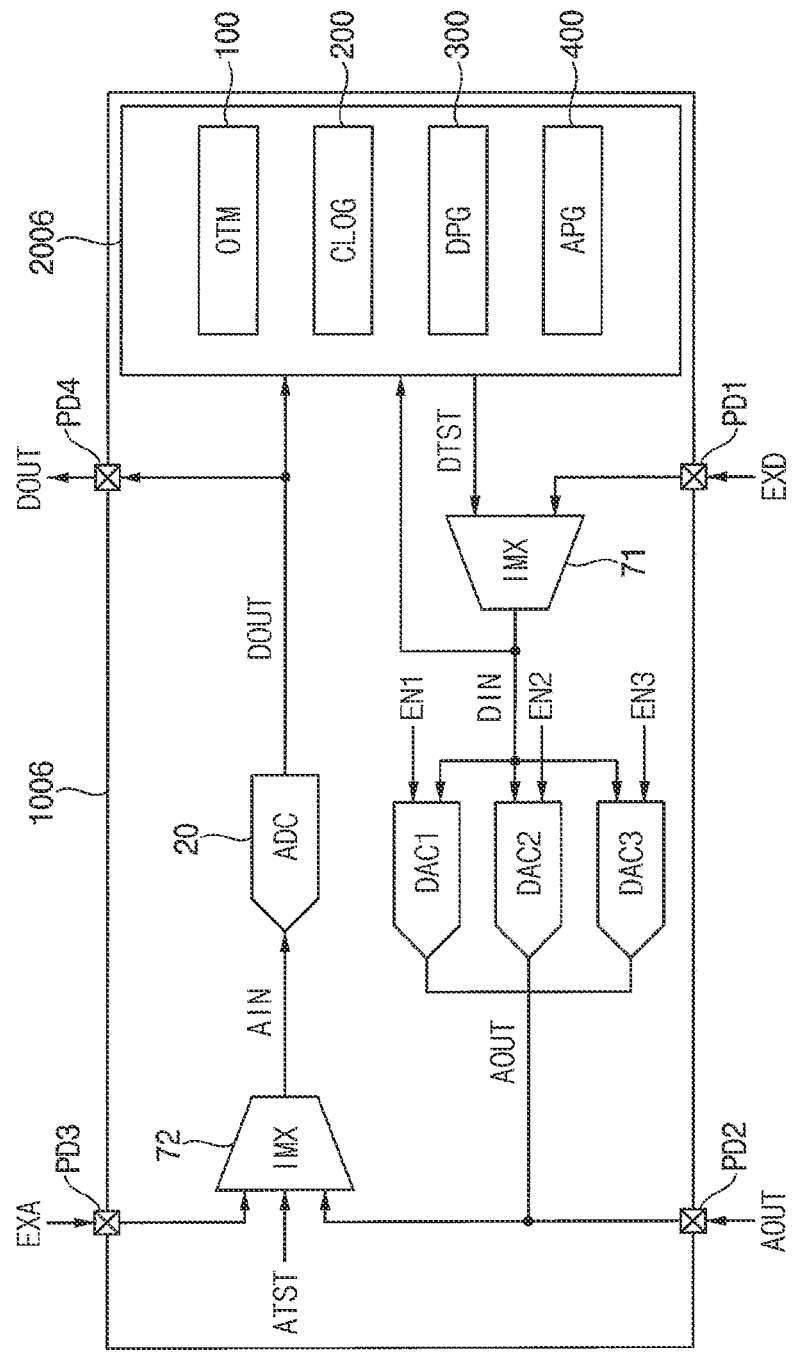

A semiconductor integrated circuit 1006 of FIG. 26 is similar to the semiconductor integrated circuit 1004 of FIG. 24 and repeated descriptions with respect to FIG. 24 may be omitted. In comparison with the semiconductor integrated circuit 1004 of FIG. 24, the semiconductor integrated circuit 1006 of FIG. 26 may include a plurality of digital-to-analog converters DAC1, DAC2 and DAC3 connected in parallel. Each of the plurality of digital-to-analog converters DAC1, DAC2 and DAC3 may perform the first normal conversion operation to generate the analog output signal AOUT by converting the digital input signal DIN corresponding to the external digital signal EXD through the pad PD1 and provide the analog output signal AOUT corresponding to the external digital signal EXD through the pad PD2 to the external device.

The built-in self-test circuit 2006 may perform the real-time monitoring operation as described above with reference to each of the plurality of digital-to-analog converters DAC1, DAC2 and DAC3 by enabling each of the plurality of digital-to-analog converters DAC1, DAC2 and DAC3.

When the built-in self-test circuit 2006 determines one digital-to-analog converter operates abnormally by the real-time monitoring operation, the built-in self-test circuit 2006 may disable the digital-to-analog converter operating abnormally and enable another digital-to-analog converter.

The plurality of digital-to-analog converters DAC1, DAC2 and DAC3 may be enabled based on a plurality of enable signals EN1, EN2 and EN3, respectively. The control logic 200 may activate the one enable signal corresponding to the digital-to-analog converter 10 that is determined as operating normally by the real-time monitoring operation and deactivate the other enable signals.

Figure 27:
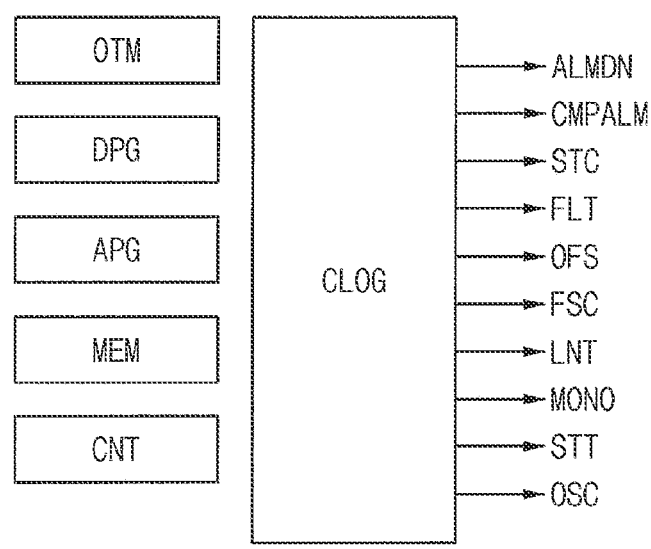
FIG. 27 is a block diagram illustrating a built-in self-test circuit according to example embodiments.

FIG. 27 is a block diagram illustrating a built-in self-test circuit according to example embodiments.

Referring to FIG. 27, a built-in self-test circuit 2100 may include a control logic CLOG, an on-time monitor OTM, a digital test signal generator DPG, an analog test signal generator APG, a memory MEM, and a counter CNT. The control logic CLOG may control overall operations of the built-in self-test circuit 2100.

As described above, the built-in self-test circuit 2100 may perform the real-time monitoring operation using the on-time monitor OTM to generate the comparison alarm signal CMPALM indicating whether the digital-to-analog converter in the semiconductor integrated circuit operates normally. In addition, the built-in self-test circuit 2100 may perform the monitor test operation using the on-time monitor OTM and the digital test signal generator DPG to generate the comparison alarm signal CMPALM indicating whether the on-time monitor OTM operates normally. The on-time monitor 100 may further generate a comparison done signal ALLMAN that is activated whenever the comparison circuit 160 performs a comparison operation, regardless of the comparison result, that is, regardless of a value of the comparison alarm signal CMPALM.

As described with reference to FIG. 24, the built-in self-test circuit 2100 may apply the digital test signal DTST and/or the analog test signal ATST to the digital-to-analog converter 10 and/or the analog-to-digital converter 20, using the input multiplexers 71 and 72. The built-in self-test circuit 2100 may generate various alarm signals by performing various test operations with respect to the data converters such as the digital-to-analog converter 10 and the analog-to-digital converter 20, using the digital test signal DTST and/or the analog test signal ATST.

For example, the alarm signals may include a stuck alarm signal STC indicating whether the output of the data converter is fixed regardless of the input of the data converter, a floating alarm signal FLT indicating whether the output node of the data converter is floating, an offset alarm signal OFS and a full scale alarm signal FSC indicating whether the output of the data converter is in a normal range, a linearity alarm signal LNT and a monotonicity alarm signal MONO indicating whether the output of the data converter changes normally according the input change of the data converter, a settling alarm signal STT indicating whether the data converter is enabled within a predetermined time interval, an oscillation alarm signal OSC indicating whether the output of the data converter is oscillating, etc.

Figure 28:
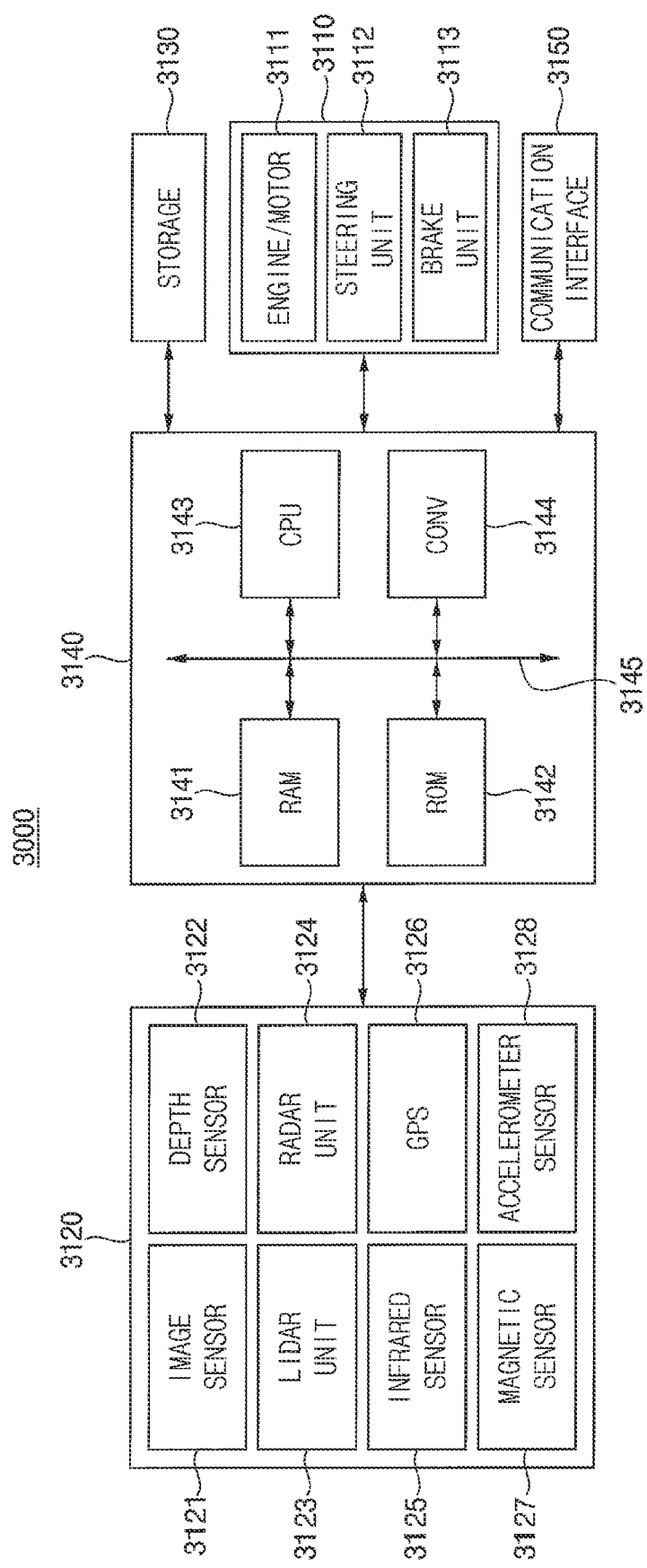
FIG. 28 is a block diagram illustrating an autonomous driving device according to example embodiments.

FIG. 28 is a block diagram illustrating an autonomous driving device according to example embodiments.

Referring to FIG. 28, an autonomous driving device 3000 may include a driver (e.g., including circuitry) 3110, a sensor 3120, a storage 3130, a controller (e.g., including processing circuitry) 3140, and a communication interface 3150.

The driver 3110 may, for example, be a configuration for driving the autonomous driving device 3000 and may include various circuitry. In a case that the autonomous driving device 3000 is implemented as a land-based vehicle, the driver 3110 may include various circuitry, such as, for example, an engine/motor 3111, a steering unit 3112, a brake unit 3113 and the like.

The engine/motor 3111 may include any combination of an internal combustion engine, an electric motor, a steam locomotive, and a stirling engine. For example, in a case that the autonomous driving device 3000 is a gas-electric hybrid car, the engine/motor 3111 may be a gasoline engine and an electric motor. For example, the engine/motor 3111 may supply energy for the autonomous driving device 3000 to drive on a predetermined driving route.

The steering unit 3112 may be any combination of mechanisms included to control a direction of the autonomous driving device 3000. For example, when an obstacle is recognized while the autonomous driving device 3000 is driving, the steering unit 3112 may change the direction of the autonomous driving device 3000. In a case that the autonomous driving device 3000 is a land-based vehicle, the steering unit 3112 may turn the steering wheel clockwise or counterclockwise, and change the direction of the autonomous driving device 3000 accordingly.

The brake unit 3113 may be any combination of mechanisms included to decelerate the autonomous driving device 3000. For example, the brake unit may use friction to reduce a speed of wheels/tires. When an obstacle is recognized while the autonomous driving device 3000 is driving, the brake unit 3113 may decelerate the autonomous driving device 3000.

The driver 3110 may be for an autonomous driving device 3000 driving on the ground, but is not limited thereto. The driver 3110 may include a flight propulsion unit, a propeller, wings, etc. and may include a variety of vessel propulsion devices.

The sensor 3120 may include a number of sensors configured to sense information relating to a surrounding environment of the autonomous driving device 3000. For example, the sensor 3120 may include at least one of an image sensor 3121, a depth sensor/camera 3122, a LIDAR unit 3123, a RADAR unit 3124, an infrared sensor 3125, a Global Positioning System (GPS) 3126, a magnetic sensor 3127, and an accelerometer sensor 3128.

The image sensor 3121 may capture an external object located outside of the autonomous driving device 3000. The captured external object may be used as a data for changing at least one of a velocity and direction of the autonomous driving device 3000. The image sensor 3121 may include a sensor of various types, such as a charge coupled device (CCD) and a complementary metal oxide semiconductor (CMOS). In addition, the depth sensor/camera 3122 may acquire a depth for determining a distance between the autonomous driving device 3000 and an external object.

The LIDAR unit 3123, the RADAR unit 3124 and the infrared sensor 3125 may be a sensor configured to output a particular signal and sense external objects in an environment in which the autonomous driving device 3000 is located. For example, the LIDAR unit 3123 may include a laser light source and/or laser scanner configured to radiate a laser, and a detector configured to detect reflection of the laser. The RADAR unit 3124 may be a sensor configured to sense objects in the environment in which the autonomous driving device 3000 is located, using a wireless signal. In addition, the RADAR unit 3124 may be configured to sense speeds and/or directions of the objects. The infrared sensor 3125 may be a sensor configured to sense external objects in an environment in which the autonomous driving device 3000 is located using a light of a wavelength of an infrared area.

The GPS 3126, the magnetic sensor 3127 and the accelerometer sensor 3128 may be a sensor configured to acquire information relating to a velocity, direction, location, etc. of the autonomous driving device 3000. For example, information relating to a current state of the autonomous driving device 3000 may be acquired and a possibility of collision with an external object, etc. may be identified. The GPS 3126 may receive a location of the autonomous driving device 3000 as a latitude and altitude data through a satellite, and the magnetic sensor 3127 and the accelerometer sensor 3128 may identify the current state of the autonomous driving device 3000 according to momentum of the autonomous driving device 3000.

The storage 3130 may store data used by the controller 3140 to execute various processing. For example, the storage 3130 may be realized as an internal memory such as ROM, RAM and the like included in the controller 3140, and may be realized as a separate memory from the controller 3140. In this case, the storage 3130 may be realized in the form of a memory embedded in the autonomous driving device 3000, or may be realized in the form of a memory that may be detachable from the autonomous driving device 3000 according to the usage of data storage. For example, data for driving the autonomous driving device 3000 is stored in a memory embedded in the autonomous driving device 3000, and data for an extension function of the autonomous driving device 3000 may be stored in a memory that may be detached from the autonomous driving device 3000. The memory embedded in the autonomous driving device 3000 may be realized in the form of a non-volatile memory, volatile memory, flash memory, hard disk drive (HDD), solid state drive (SDD), or the like, and the memory that may be detached from the autonomous driving device 3000 may be realized in the form of a memory card (e.g., micro SD card, USB memory), an external memory that is connectable to a USB port (e.g. USB memory), and the like.

The communication interface 3150 may include various communication circuitry and communicates with the autonomous driving device 3000 and an external device. For example, the communication interface 3150 may transmit and receive driving information of the autonomous driving device 3000 and the external device. For example, the communication interface 3150 may perform communication through various communication methods such as an Infrared (IR) communication, a Wireless Fidelity (WI-FI), Bluetooth, Zigbee, Beacon, near field communication (NFC), WAN, Ethernet, IEEE 1394, HDMI, USB, MHL, AES/EBU, Optical, Coaxial, and the like. However, according to circumstances, the communication interface 3150 may communicate driving information through a server (not illustrated).

The controller 3140 may include a random access memory (RAM) 3141, a read only memory (ROM) 3142, a central processing unit (CPU) 3143, a converter (CONV) 3144 and a bus 3145. The RAM 3141, the ROM 3142, the CPU 3143 and the CONV 3144 may be connected to each other through the bus 3145. The controller 3140 may be realized as a system on chip (SoC).

The RAM 3141 may be a memory for reading, from the storage 3130, various instructions, etc. related to driving of the autonomous driving device 3000. The ROM 3142 may store a set of instructions for system booting. In response to a turn on command being input to the autonomous driving device 3000 and power being supplied, the CPU 3143 may copy an operating system (O/S) stored in the storage 3130 into the RAM 3141 according to a command stored in the ROM 3142, and boot the system by executing the O/S. If booting is completed, the CPU 3143 performs various operations by copying various types of application programs stored in the storage 3130 into the RAM 3141 and executing the application programs copied into the RAM 3141. The controller 3140 may perform various operations using a module stored in the storage 3130.

The CONV 3144 may be implemented as a semiconductor integrated circuit as described with reference to FIGS. 1 through 27. In some example embodiments, the CONV 3144 may be implemented as a single semiconductor chip. The CONV 3144 may include a digital-to-analog converter and a built-in self-test circuit as described above. The CONV 3144 may convert analog signals obtained by the sensor 3120 to digital signals and provide the digital signals to the CPU 3143. In addition, the CONV may convert digital control signals from the CPU 3143 to analog signals to control the driver 3110. Accordingly, in some embodiments, an external device described herein may comprise a device, such as a processor (e.g., the CPU 3143) and/or the driver 3110, of a vehicle (e.g., the autonomous driving device 3000).

According to example embodiments, the built-in self-test circuit included in the CONV 3144 may perform the real-time monitoring operation, using the on-time monitor as described above, to monitor whether the digital-to-analog converter in the CONV 3144 operates normally, while the digital-to-analog converter performs the normal conversion operation. In addition, the built-in self-test circuit may perform the monitor test operation to test whether the on-time monitor operates normally.

Figure 29:
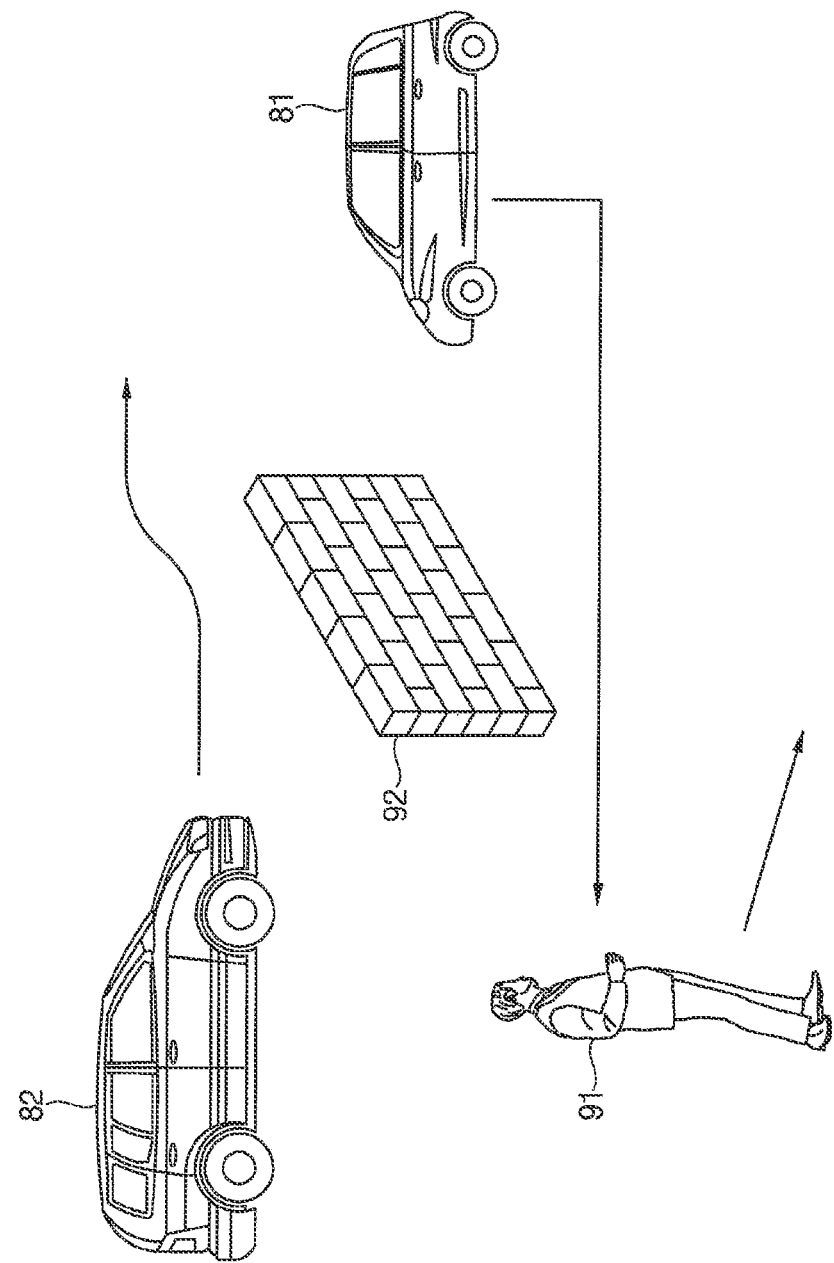
FIG. 29 is a diagram for describing an operation of the autonomous driving device of FIG. 28.

FIG. 29 is a diagram for describing an operation of the autonomous driving device of FIG. 28.

The autonomous driving device may refer, for example, to a device including various circuitry capable of autonomous driving without intervention of a driver. The autonomous driving device may be implemented as a land-based vehicle having four or more wheels. However, the example is not limited thereto, and the autonomous driving device may be implemented as a variety of means of transportation such as, for example, and without limitation, two-wheeled vehicles, robots, air vehicles, and the like. In some examples of the disclosure, it is assumed that the autonomous driving device is implemented as a land-based vehicle that is an automobile for convenience of explanation. The term "vehicle," however, is not limited to automobiles or other land-based vehicles. Rather, the term "vehicle" also encompasses aircraft and watercraft.

Referring to FIG. 29, a situation where the autonomous driving device 81 may collide with a variety of obstacles 82, 91 and 92 while the autonomous driving device 81 is driven is illustrated. The autonomous driving device 81 may store different information for each obstacle type in advance. When an obstacle is recognized, the autonomous driving device 81 may identify a type of the obstacle, and control a traveling method of the autonomous driving device 81 according to the identification result.

For example, the autonomous driving device 81 may identify an obstacle type as a moving object such as an animal or a pedestrian 91, a structure 92, and a moving object such as a driving vehicle 82.

The pedestrian 91 moves slower than the driving vehicle 82. In addition, the pedestrian 91 may stop motion before collision with the autonomous driving device 81. Accordingly, it may be considered that the avoidance when a collision is expected is low for the pedestrian 91. Although there is a difference according to an animal size, it may be considered that a damage at the time of collision is low as compared with a hard object such as a wall, a peripheral vehicle, and the like. When a damage at the time of collision is identified, not only whether the vehicle is damaged but also a security of the pedestrian 91 is important. Thus, a damage at the time of collision may be set high for the pedestrian 91.

On the other hand, it may be identified (determined) that the structure 92 does not move, has no avoidance when a collision is expected, and that a damage at the time of collision is high. In a case that the moving object 82 such as a vehicle and the like is an obstacle, it may be identified that the obstacle has a high moving speed, has a high avoidance when a collision is expected, and that a damage is high at the time of collision.

The autonomous driving device 81 may select a path for avoiding collision with the autonomous driving device 81 and/or reducing risks at the time of collision based on a type of the identified obstacle. For example, if it is possible to avoid collision, the autonomous driving device 81 may drive on a path on which the device 81 is capable of avoiding collision, and if it is impossible to avoid collision, the autonomous driving device 81 may drive on a path for minimizing and/or reducing damages to the autonomous driving device 81 or the obstacle at the time of collision.

In a case that the moving object 82 is another autonomous driving vehicle, driving information may be communicated between the autonomous driving devices 81 and 82, thereby a driving path may be negotiated and a path of the autonomous driving device 81 may be identified.

In case of the autonomous driving vehicle 81, high reliability may be required in data conversion for obtaining information and data conversion for driving the autonomous driving vehicle 81. According to example embodiments, the reliability of the data conversion by the semiconductor integrated circuit including the data converter may be enhanced through the real-time monitoring operation and the monitor test operation as described above.

Figure 30:
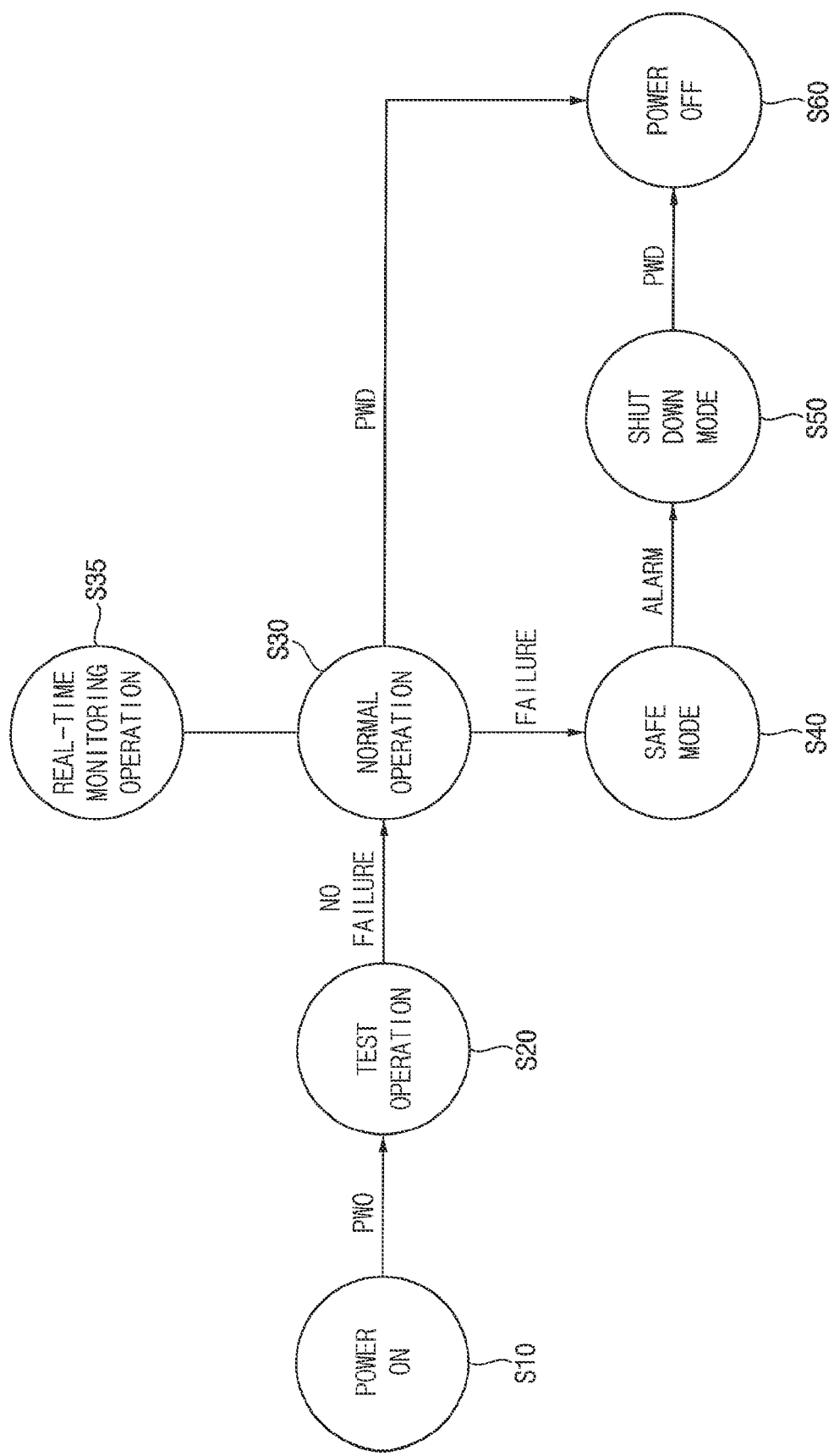
FIG. 30 is a diagram illustrating an example embodiment of an operation of an autonomous driving device including a semiconductor integrated circuit according to example embodiments.

FIG. 30 is a diagram illustrating an example embodiment of an operation of an autonomous driving device including a semiconductor integrated circuit according to example embodiments.

Referring to FIG. 30, when a system including a semiconductor integrated circuit according to example embodiments is powered on (Block S10), a built-in self-test circuit included in the semiconductor integrated circuit may perform test operations in response to a power-on signal PWO (Block S20). When the data converter included in the semiconductor integrated circuit operates normally (NO FAILURE), the data converter may perform the normal operation (Block S30). While the data converter performs the normal operation (Block S30), the built-in self-test circuit may perform the real-time monitoring operation using the on-time monitor (Block S35).

When the data converter operates abnormally (FAILURE), the system may enter a safe mode (Block S40), and the above-described alarm signals ALARM may be provided to the controller of the system such as the autonomous driving device. The controller may set the semiconductor integrated circuit including the data converter in a shutdown mode based on the alarm signals ALARM (Block S50). The controller may power off the semiconductor integrated circuit including the data converter (Block S60) in response to a power-down signal PWD to block the output of the semiconductor integrated circuit or save power consumption.

As described above, the built-in self-test circuit according to example embodiments may enhance performance and reliability of the digital-to-analog converter and the semiconductor integrated circuit including the digital-to-analog converter by monitoring in real-time abnormality of the digital-to-analog converter using the on-time monitor. In addition, the built-in self-test circuit according to example embodiments may further enhance reliability of the digital-to-analog converter and the semiconductor integrated circuit including the digital-to-analog converter by testing abnormality of the on-time monitor.

The example embodiments may be applied to any electronic devices and systems. For example, the invention may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an autonomous driving system, etc.

The foregoing is illustrative of example embodiments and is not to be construed as limiting thereof. Although a few example embodiments have been described, those skilled in the art will readily appreciate that many modifications are possible in the example embodiments without materially departing from the present invention.

What is claimed is:
1. A semiconductor integrated circuit comprising:
   a digital-to-analog converter configured to perform a conversion operation to generate an analog output signal by converting a digital input signal corresponding to an external digital signal that is provided from an external device outside the semiconductor integrated circuit and provide the analog output signal to the external device;
   an analog-to-digital converter configured to generate a digital output signal by converting the analog output signal; and
   a built-in self-test circuit configured to, while the digital-to-analog converter performs the conversion operation, perform a real-time monitoring operation to generate a comparison alarm signal based on the digital input signal and the analog output signal, the comparison alarm signal indicating whether the digital-to-analog converter operates, the built-in self-test circuit including an on-time monitor comprising:
      a delay circuit configured to generate a digital delay signal by delaying the digital input signal based on a digital delay amount of the digital-to-analog converter and an analog delay amount of the analog-to-digital converter, and
      a comparison circuit configured to generate the comparison alarm signal by comparing the digital output signal and the digital delay signal.

2. The semiconductor integrated circuit of claim 1, wherein the comparison circuit is configured to generate the comparison alarm signal having a pass value when a difference value between the digital output signal and the digital delay signal is equal to or smaller than a reference value, and is configured to generate the comparison alarm signal having a fail value when the difference value between the digital output signal and the digital delay signal is greater than the reference value.

3. The semiconductor integrated circuit of claim 1, further comprising:
  a clock divider configured to generate, by dividing an external clock signal, a first clock signal having a first frequency, a second clock signal having a second frequency and a third clock signal having the second frequency, the first clock signal being provided to the digital-to-analog converter, the second clock signal being provided to the analog-to-digital converter, and the third clock signal being provided to the comparison circuit.

4. The semiconductor integrated circuit of claim 3, wherein the first frequency is equal to the second frequency, a phase difference between the first clock signal and the second clock signal is 90 degrees, and a phase difference between the first clock signal and the third clock signal is zero or 180 degrees.

5. The semiconductor integrated circuit of claim 3, wherein the first frequency is twice the second frequency, and a phase difference between the second clock signal and the third clock signal is 90 degrees.

6. The semiconductor integrated circuit of claim 3, wherein the delay circuit includes:
  a monitor retiming circuit configured to generate a retimed digital signal by synchronizing the digital input signal with an edge of the second clock signal; and
  a delay unit configured to generate the digital delay signal by delaying the retimed digital signal by N times of a clock cycle corresponding to the second frequency where N is a positive integer.

7. The semiconductor integrated circuit of claim 3, further comprising:
  an input retiming circuit configured to generate a retimed digital signal by synchronizing the digital input signal corresponding to the external digital signal with rising edges of the first clock signal,
  wherein the clock divider is configured to generate the first clock signal such that the first frequency is half a frequency of the external clock signal and rising edges and falling edges of the first clock signal are synchronized with edges of the external clock signal, and
  wherein the external digital signal is provided to the semiconductor integrated circuit such that the external digital signal is synchronized with rising edges of the external clock signal.

8. The semiconductor integrated circuit of claim 1, wherein the built-in self-test circuit further includes:
  a digital test signal generator configured to generate a digital test signal; and
  an input multiplexer configured to output the digital input signal by selecting one of the external digital signal and the digital test signal, and
  wherein the on-time monitor is further configured to perform a monitor test operation to generate the comparison alarm signal indicating whether the on-time monitor operates based on the digital input signal corresponding to the digital test signal.

9. The semiconductor integrated circuit of claim 8, wherein the monitor test operation includes a pass test operation to determine whether the comparison alarm signal has a pass value when the comparison circuit operates in a first manner and a fail test operation to determine whether the comparison alarm signal has a fail value when the comparison circuit operates in a second manner.

10. The semiconductor integrated circuit of claim 8, wherein the on-time monitor includes:
  a first comparison multiplexer configured to output a first comparison selection signal by selecting one of the digital delay signal and the digital test signal; and
  a second comparison multiplexer configured to output a second comparison selection signal by selecting one of the digital delay signal and the digital output signal,
  wherein the comparison circuit is configured to generate the comparison alarm signal by comparing the first comparison selection signal and the second comparison selection signal.

11. The semiconductor integrated circuit of claim 10, wherein, during the real-time monitoring operation, the first comparison multiplexer is configured to output the digital delay signal as the first comparison selection signal, and the second comparison multiplexer is configured to output the digital output signal as the second comparison selection signal.

12. The semiconductor integrated circuit of claim 10, wherein, during a pass test operation to determine whether the comparison alarm signal has a pass value when the comparison circuit operates in a first manner, the first comparison multiplexer is configured to output the digital delay signal as the first comparison selection signal, and the second comparison multiplexer is configured to output the digital delay signal as the second comparison selection signal.

13. The semiconductor integrated circuit of claim 10, wherein, during a fail test operation to determine whether the comparison alarm signal has a fail value when the comparison circuit operates in a second manner, the first comparison multiplexer is configured to output the digital test signal as the first comparison selection signal, and the second comparison multiplexer is configured to output the digital delay signal as the second comparison selection signal.

14. The semiconductor integrated circuit of claim 1, further comprising:
  wherein the built-in self-test circuit includes a plurality of on-time monitors that are connected in parallel to the digital-to-analog converter and the analog-to-digital converter,
  wherein the built-in self-test circuit is further configured to perform a monitor test operation with respect to each of the plurality of on-time monitors operates, and
  wherein the built-in self-test circuit is further configured to perform the real-time monitoring operation using one operating on-time monitor among the plurality of on-time monitors.

15. A semiconductor integrated circuit comprising:
  a first input multiplexer configured to output a digital input signal by selecting one of a digital test signal and an external digital signal that is provided from an external device outside the semiconductor integrated circuit;
  a digital-to-analog converter configured to perform a first conversion operation to generate an analog output signal by converting the digital input signal and provide the analog output signal corresponding to the external digital signal to the external device;

a second input multiplexer configured to output an analog input signal by selecting one of an analog test signal and an external analog signal that is provided from the external device;

an analog-to-digital converter configured to perform a second conversion operation to generate a digital output signal by converting the analog input signal and provide the digital output signal corresponding to the external analog signal to the external device; and a built-in self-test circuit configured to, while the digital-to-analog converter performs the first conversion operation, perform a real-time monitoring operation to generate a comparison alarm signal based on the digital input signal and the analog output signal, the comparison alarm signal indicating whether the digital-to-analog converter operates, the built-in self-test circuit including an on-time monitor comprising:
  a delay circuit configured to generate a digital delay signal by delaying the digital input signal based on a digital delay amount of the digital-to-analog converter and an analog delay amount of the analog-to-digital converter, and
  a comparison circuit configured to generate the comparison alarm signal by comparing the digital output signal and the digital delay signal.

16. The semiconductor integrated circuit of claim 15, wherein the built-in self-test circuit is configured to perform the real-time monitoring operation using the analog-to-digital converter, and the analog-to-digital converter is configured to stop performing the second conversion operation while the built-in self-test circuit performs the real-time monitoring operation.

17. The semiconductor integrated circuit of claim 15, wherein the built-in self-test circuit includes a monitoring analog-to-digital converter configured to perform the real-time monitoring operation, and the analog-to-digital converter is configured to perform the second conversion operation while the built-in self-test circuit performs the real-time monitoring operation.

18. A built-in self-test circuit for monitoring a digital-to-analog converter that generates an analog output signal by converting a digital input signal, the built-in self-test circuit comprising:
  an analog-to-digital converter configured to generate a digital output signal by converting the analog output signal;
  a digital test signal generator configured to generate a digital test signal;
  an input multiplexer configured to output the digital input signal by selecting one of an external digital signal and the digital test signal; and
  an on-time monitor configured to, while the digital-to-analog converter performs a conversion operation to generate the analog output signal by converting the digital input signal that is output by selecting the external digital signal, perform a real-time monitoring operation to monitor whether the digital-to-analog converter operates, based on a result of comparing the digital input signal and the digital output signal, the on-time monitor comprising:
    a delay circuit configured to generate a digital delay signal by delaying the digital input signal based on a digital delay amount of the digital-to-analog converter and an analog delay amount of the analog-to-digital converter, and
    a comparison circuit configured to generate a comparison alarm signal by comparing the digital output signal and the digital delay signal.

* * * * *